US009620671B2

(12) United States Patent
Nakatsu et al.

(10) Patent No.: US 9,620,671 B2
(45) Date of Patent: Apr. 11, 2017

(54) NITRIDE SEMICONDUCTOR LIGHT EMITTING ELEMENT AND METHOD FOR MANUFACTURING SAME

(71) Applicant: Sharp Kabushiki Kaisha, Osaka-shi (JP)

(72) Inventors: Hiroshi Nakatsu, Osaka (JP); Tomoya Inoue, Osaka (JP); Kentaro Nonaka, Osaka (JP); Toshiaki Asai, Osaka (JP); Tadashi Takeoka, Osaka (JP); Yoshihiko Tani, Osaka (JP)

(73) Assignee: SHARP KABUSHIKI KAISHA, Osaka-shi (JP)

( * ) Notice: Subject to any disclaimer, the term of this patent is extended or adjusted under 35 U.S.C. 154(b) by 112 days.

(21) Appl. No.: 14/407,241

(22) PCT Filed: May 15, 2013

(86) PCT No.: PCT/JP2013/063482
§ 371 (c)(1),
(2) Date: Dec. 11, 2014

(87) PCT Pub. No.: WO2013/187171
PCT Pub. Date: Dec. 19, 2013

(65) Prior Publication Data
US 2015/0171263 A1 Jun. 18, 2015

(30) Foreign Application Priority Data

Jun. 13, 2012 (JP) .................................. 2012-133489

(51) Int. Cl.
*H01L 33/00* (2010.01)
*H01L 33/06* (2010.01)
(Continued)

(52) U.S. Cl.
CPC ........ *H01L 33/0075* (2013.01); *H01L 33/007* (2013.01); *H01L 33/0025* (2013.01);
(Continued)

(58) Field of Classification Search
None
See application file for complete search history.

(56) References Cited

U.S. PATENT DOCUMENTS 6,329,667 B1 12/2001 Ota et al.
2002/0084452 A1 7/2002 Ota et al.
(Continued)

FOREIGN PATENT DOCUMENTS

CN 1487606 4/2004
JP 11-112109 4/1999
(Continued)

OTHER PUBLICATIONS

International Searching Authority. English Translation of the Written Opinion of the International Searching Authority. International Application No. PCT/JP2013/063482. Date of mailing Jun. 11, 2013. pp. 1-6.*
(Continued)

*Primary Examiner* — Hoang-Quan Ho
(74) *Attorney, Agent, or Firm* — Morrison & Foerster LLP

(57) ABSTRACT

A nitride semiconductor light emitting element is provided with: a substrate; a buffer layer that is provided on the substrate; a base layer that is provided on the buffer layer; an n-side nitride semiconductor layer that is provided on the base layer; an MQW light emitting layer that is provided on the n-side nitride semiconductor layer; and a p-side nitride semiconductor layer that is provided on the MQW light emitting layer. An x-ray rocking curve half-value width ω (004) with respect to a (004) plane, i.e., the crystal plane of
(Continued)

the nitride semiconductor, is 40 arcsec or less, or the x-ray rocking curve half-value width ω (102) with respect to a (102) plane is 130 arcsec or less, and the rate P (80)/P (25) between light output P (25) at 25° C. and light output P (80) at 80° C. with a same operating current is 95% or more.

10 Claims, 6 Drawing Sheets

(51) Int. Cl.
H01L 33/12 (2010.01)
H01L 33/24 (2010.01)
H01L 33/32 (2010.01)
H01L 33/22 (2010.01)
H01L 33/02 (2010.01)

(52) U.S. Cl.
CPC ............. *H01L 33/06* (2013.01); *H01L 33/12* (2013.01); *H01L 33/22* (2013.01); *H01L 33/24* (2013.01); *H01L 33/32* (2013.01); *H01L 33/025* (2013.01); *H01L 2933/0033* (2013.01)

(56) References Cited

U.S. PATENT DOCUMENTS

| | | |
|---|---|---|
| 2003/0010993 A1 | 1/2003 | Nakamura et al. |
| 2003/0119239 A1 | 6/2003 | Koike et al. |
| 2004/0061119 A1 | 4/2004 | Inoue et al. |
| 2005/0093099 A1 | 5/2005 | Koike et al. |
| 2008/0149955 A1 | 6/2008 | Nakamura et al. |
| 2011/0049544 A1* | 3/2011 | Komada ............. H01L 21/0242 257/97 |
| 2011/0062016 A1* | 3/2011 | Araki ................. C23C 14/0036 204/192.25 |
| 2012/0112188 A1* | 5/2012 | Yokoyama ......... H01L 21/0242 257/51 |
| 2012/0319162 A1* | 12/2012 | Araki ................. H01L 21/0237 257/103 |
| 2013/0001644 A1* | 1/2013 | Fujikura ............. H01L 21/0237 257/190 |
| 2013/0277684 A1* | 10/2013 | Araki ................. H01L 21/0243 257/76 |
| 2014/0077157 A1 | 3/2014 | Nakamura et al. |

FOREIGN PATENT DOCUMENTS

| | | |
|---|---|---|
| JP | 2000-232238 | 8/2000 |
| JP | 2005-57308 | 3/2005 |
| JP | 2008-71773 | 3/2008 |
| JP | 2011-61063 | 3/2011 |
| JP | 2012-28476 | 2/2012 |
| JP | 2012-104564 | 5/2012 |
| TW | 518767 | 1/2003 |
| WO | WO-2011/108422 | 9/2011 |

OTHER PUBLICATIONS

International Search Report mailed Jun. 11, 2013, directed to International Application No. PCT/JP2013/063482; 4 pgs.

* cited by examiner

NITRIDE SEMICONDUCTOR LIGHT EMITTING ELEMENT AND METHOD FOR MANUFACTURING SAME

CROSS-REFERENCE TO RELATED APPLICATIONS

This application is a national phase filing under 35 U.S.C. §371 of International Application No. PCT/JP2013/063482, filed on May 15, 2013, and which claims priority to Japanese Patent Application No. 2012-133489, filed on Jun. 13, 2012, the contents of which prior applications are incorporated herein by reference.

FIELD OF THE INVENTION

The present invention relates to a nitride semiconductor light emitting element and a method of manufacturing such a nitride semiconductor light emitting element.

BACKGROUND OF THE INVENTION

A III-V compound semiconductor material containing nitrogen (hereinafter referred to as a "nitride semiconductor material") has a band gap corresponding to the energy of light having wavelengths from the infrared region to the ultraviolet region. Hence, the nitride semiconductor material is useful for the material of a light emitting element that emits light having wavelengths from the infrared region to the ultraviolet region, the material of a light emitting element that receives light having wavelengths in the regions and the like.

The bond between the atoms of the nitride semiconductor material is strong, the breakdown voltage of the nitride semiconductor material is high and the saturation electron velocity of the nitride semiconductor material is high. Hence, the nitride semiconductor material is also useful as the material of an electronic device such as a high-frequency transistor that is resistant to high temperature and that produces a high output. Furthermore, since the nitride semiconductor material hardly harms the environment, attention is focused on the nitride semiconductor material as an easy-to-handle material.

In a nitride semiconductor light emitting element using such a nitride semiconductor material, as a light emitting layer, a quantum well structure is generally adopted. When voltage is applied to the nitride semiconductor light emitting element, an electron and a hole are recombined in a well layer forming the light emitting layer, and thus light is generated. The light emitting layer may be formed with a single quantum well (SQE) structure or may be formed with a multiple quantum well (MQW) structure in which the well layer and a barrier layer are alternately deposited.

It is known that advantageously, in the nitride semiconductor light emitting element, as compared with an AlGaInP LED (light emitting diode), the temperature is less varied by variations in ambient temperature. A conventional nitride semiconductor light emitting element disclosed in patent document 1 is a light emitting diode, on an n-type nitride semiconductor layer formed on a sapphire substrate, an active layer having $In_xGa_{1-x}N$ (0.4<x<1) sandwiched between an undoped GaN layer and a p-type AlGaN layer is provided and the ratio between In and Ga in the active layer is set such that yellow or amber light is emitted. Advantageously, in the nitride semiconductor light emitting element configured as described above, as compared with a conventionally and widely used amber light emitting element using AlInGaP, a large light emission output is produced, and the light emission output is less dependent on temperature as compared with the AlInGaP amber light emitting element. In the nitride semiconductor light emitting element described above, when it is driven with a current of 20 mA, at a temperature of 80° C., 90% of the light emission output at room temperature is maintained as its light emission output.

In patent document 2, it is described that it is possible to obtain the temperature characteristics of such a light emission output because of the unique characteristics of its material. Specifically, in the conventional amber light emitting element using AlInGaP, in order to perform lattice matching on a GaAs substrate and an AlInGaP epitaxial layer used as the substrate, the amount of offset of a band gap between the active layer and a clad layer is inevitably lowered. Consequently, as the temperature is increased, the amount of overflow of carriers is increased, and thus the temperature dependence is increased.

Patent document 2 also discloses a conventional nitride semiconductor light emitting element in which an AlON buffer layer is formed on the surface of the substrate by a sputtering method, and on the surface of the AlON buffer layer, a GaN layer is grown by a depression MOCVD method. It is disclosed that in the nitride semiconductor light emitting element described above, an X ray (rocking curve) half-value width of an AlN (002) plane of an AlNO buffer layer 2 in a sample where a satisfactory GaN characteristic was obtained was 300 arc sec or less and the refractive index was 2.08 or less. It is thought that as the value of the X ray half-value width is lowered, a satisfactory crystal where the number of dislocations is lowered is obtained.

In a nitride semiconductor light emitting element disclosed in patent document 3, an active layer contains an n-type impurity, and the n-type dopant concentration of the active layer located on the side of an n-layer is higher than the n-type dopant concentration of the active layer located on the side of a p-layer. Thus, it is possible to compensate for the supply of a donor from the side of the n-layer to the active layer and thereby enhance a light emission output.

PATENT DOCUMENT

Patent document 1: Japanese Unexamined Patent Application Publication No. 11-112109
Patent document 2: WO2011/108422
Patent document 3: Japanese Unexamined Patent Application Publication No. 2005-057308

SUMMARY OF THE INVENTION

However, when the conventional nitride semiconductor light emitting element is driven with a high current at a high temperature, its luminous efficiency is disadvantageously lowered. This may cause the power efficiency per unit power to be lowered.

The present invention is made in view of the forgoing problem, and an object of the present invention is to provide a nitride semiconductor light emitting element that can reduce the decrease in luminous efficiency when it is driven at a high temperature or when it is driven with a high current and a method of manufacturing such a nitride semiconductor light emitting element.

To solve the foregoing problem, according to the present invention, there is provided a nitride semiconductor light emitting element including: a substrate; a buffer layer that is provided on the substrate; a foundation layer that is provided on the buffer layer; an n-type nitride semiconductor layer that is provided on the foundation layer; a light emitting layer that is provided on the n-type nitride semiconductor layer; and a p-type nitride semiconductor layer that is provided on the light emitting layer, where the X ray rocking curve half-value width ω (004) of a (004) plane that is a crystal plane of each of the layers of the nitride semiconductor light emitting element is 40 arc sec or less or the X ray rocking curve half-value width ω (102) of a (102) plane is 130 arc sec or less, and a ratio P (80)/P (25) between a light output P (25) at 25° C. and a light output P (80) at 80° C. with the same operating current is 95% or more.

The "(004)" and "(102)" described here mean crystal directions. Although strictly speaking the crystal direction, (004) is (0004), and (102) is (10-12), in the present specification, in short, they are represented by (004) and (102).

In the nitride semiconductor light emitting element configured as described above, the nitride semiconductor light emitting element is driven in a high-current region where a current density is 20 A/cm$^2$ or more.

In the nitride semiconductor light emitting element configured as described above, the buffer layer is formed of AlON.

In the nitride semiconductor light emitting element configured as described above, the substrate includes a plurality of concave portions and a plurality of convex portions arranged between the adjacent concave portions in a surface on which the buffer layer is provided, and the foundation layer provided on the buffer layer includes: a first foundation layer that is formed on the concave portions of the substrate and that includes a diagonal facet plane; and a second foundation layer that is formed so as to cover the first foundation layer and the convex portions of the substrate.

In the nitride semiconductor light emitting element configured as described above, the light emitting layer is formed with a multiple quantum well where a well layer and a barrier layer are alternatively deposited, and includes four or more undoped barrier layers or lightly doped barrier layers which are doped with an n-type dopant and in which a dopant concentration is $2 \times 10^{17}$ cm$^{-3}$ or less and the ratio P (80)/P (25) between the light output P (25) at 25° C. and the light output P (80) at 80° C. with the same operating current is 95% or more.

In the nitride semiconductor light emitting element configured as described above, the barrier layer has a thickness equal to or more than 3 nm but equal to or less than 7 nm.

In the nitride semiconductor light emitting element configured as described above, the n-type nitride semiconductor layer includes an intermediate layer below the light emitting layer and includes a multilayer structure member below the intermediate layer, the intermediate layer is formed by depositing a plurality of nitride semiconductor layers and is formed by alternately depositing a nitride semiconductor layer whose band gap energy is relatively lower than a band gap energy of an adjacent nitride semiconductor layer and a nitride semiconductor layer having a relatively higher band gap energy and the multilayer structure member is formed by depositing a plurality of nitride semiconductor layers, and is formed by alternately depositing a nitride semiconductor layer which has a thickness more than a thickness of each of the layers of the intermediate layer and whose band gap energy is relatively lower than a band gap energy of an adjacent nitride semiconductor layer and a nitride semiconductor layer which has a thickness more than a thickness of each of the layers of the intermediate layer and whose band gap energy is relatively higher than a band gap energy of an adjacent nitride semiconductor layer.

In the nitride semiconductor light emitting element configured as described above, the n-type nitride semiconductor layer includes a lower n-type nitride semiconductor layer and an n-type nitride semiconductor modulation doped layer formed on the lower n-type nitride semiconductor layer, and the n-type nitride semiconductor modulation doped layer includes at least a nitride semiconductor layer whose n-type dopant concentration is lower than an n-type dopant concentration of the lower n-type nitride semiconductor layer.

In the nitride semiconductor light emitting element configured as described above, the n-type nitride semiconductor layer includes the lower n-type nitride semiconductor layer and a low-temperature n-type nitride semiconductor layer that is provided on the lower n-type nitride semiconductor layer and that is grown at a temperature which is 50° C. to 400° C. lower than the lower n-type nitride semiconductor layer, and an n-type dopant concentration of the low-temperature n-type nitride semiconductor layer is 1.1 times as high as an n-type dopant concentration of the n-type nitride semiconductor layer.

In the nitride semiconductor light emitting element configured as described above, the intermediate layer is provided below the light emitting layer, the intermediate layer is a superlattice layer that is formed by depositing a plurality of nitride semiconductor layers and that is formed by alternately depositing a nitride semiconductor layer whose band gap energy is relatively lower than a band gap energy of an adjacent nitride semiconductor layer and a nitride semiconductor layer having a relatively higher band gap energy and in the intermediate layer, at least two nitride semiconductor layers located on a side of the light emitting layer are formed with an n-type semiconductor layer, and an nitride semiconductor layer located on a side of the substrate as compared with the n-type semiconductor layer is formed with an undoped layer.

To solve the foregoing problem, according to the present invention, there is provided a method of manufacturing a nitride semiconductor light emitting element that is formed by providing an n-type nitride semiconductor layer, a light emitting layer and a p-type nitride semiconductor layer, the method including: a step of providing, in a surface of a substrate, a plurality of concave portions and a plurality of convex portions arranged between the adjacent concave portions; a step of providing, on the substrate, an AlN or AlON buffer layer by a sputtering method; a step of providing, on the buffer layer, a foundation layer by a MOCVD method; a step of providing, on the foundation layer, the n-type nitride semiconductor layer; a step of providing, on the n-type nitride semiconductor layer, the light emitting layer; and a step of providing, on the light emitting layer, the p-type nitride semiconductor layer.

In the method of manufacturing a nitride semiconductor light emitting element configured as described above, the step of providing the foundation layer includes: a step of providing a first foundation layer including a diagonal facet plane on the concave portions in the substrate; and a step of providing a second foundation layer so as to cover the first foundation layer and the convex portions of the substrate.

In the method of manufacturing a nitride semiconductor light emitting element configured as described above, the step of providing the n-type nitride semiconductor layer includes: a step of forming, at a first growth temperature, a lower n-type nitride semiconductor layer and an n-type nitride semiconductor modulation doped layer; a step of forming, on the n-type nitride semiconductor modulation doped layer, a low-temperature n-type nitride semiconductor layer at a second growth temperature which is 50° C. to 400°

C. lower than the first growth temperature; a step of forming, on the low-temperature n-type nitride semiconductor layer, at a third growth temperature equal to or less than the second growth temperature, a multilayer structure member that is formed by depositing a plurality of nitride semiconductor layers whose band gap energies are different; and a step of forming, on the multilayer structure member, at a fourth growth temperature equal to or less than the third growth temperature, an intermediate layer formed with a superlattice of a plurality of nitride semiconductor layers whose band gap energies are different.

In the configuration of the present invention, especially if the drive temperature is varied, the luminous efficiency remains substantially constant. Thus, it is possible to provide a nitride semiconductor light emitting element that can reduce the decrease in luminous efficiency when it is driven at a high temperature or when it is driven with a high current and a method of manufacturing such a nitride semiconductor light emitting element.

DETAILED DESCRIPTION OF THE INVENTION

Figure 1:
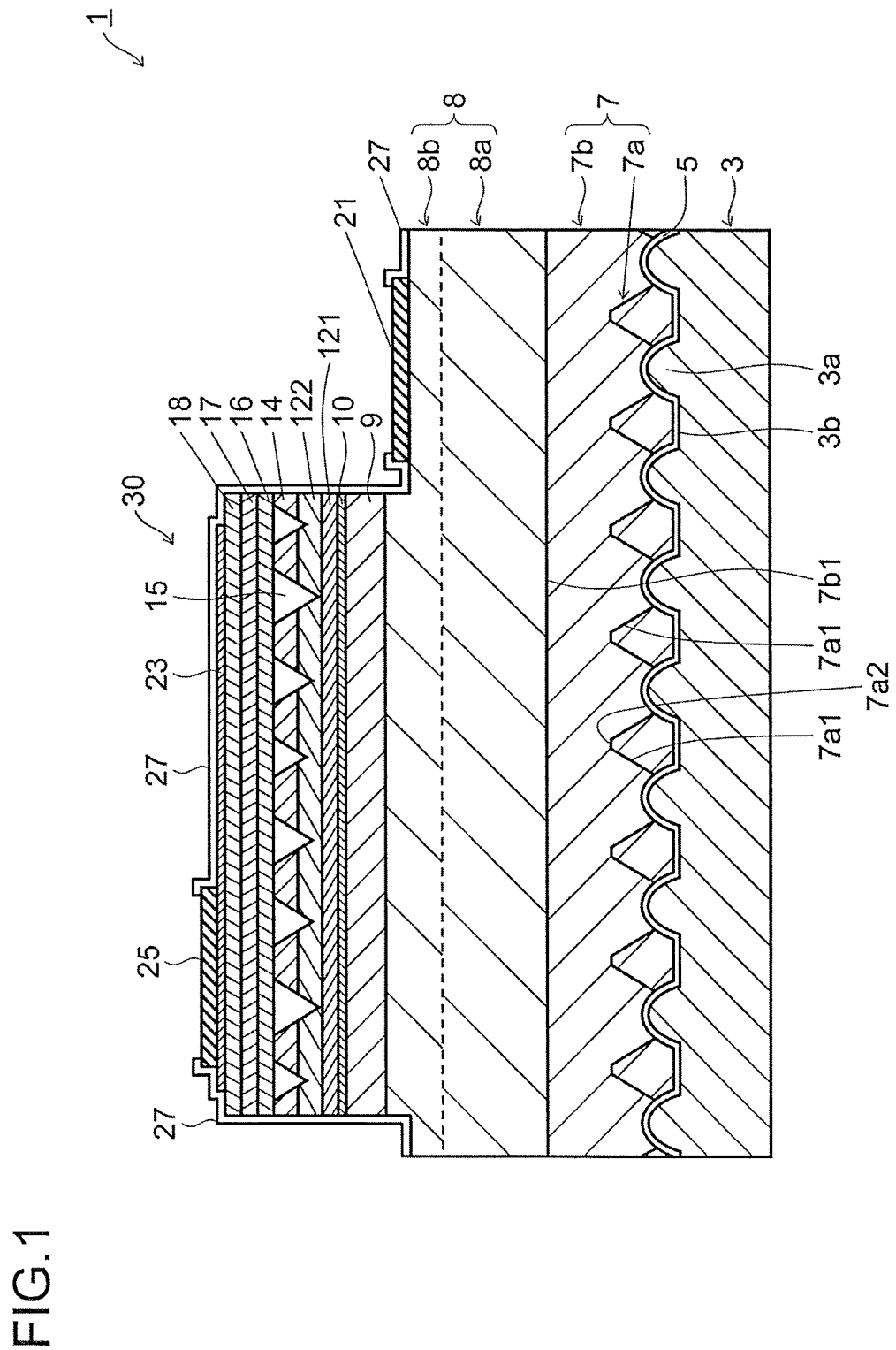
FIG. 1 A schematic side view of a nitride semiconductor light emitting element according to an embodiment of the present invention.

An embodiment of the present invention will be described below with reference to accompanying drawings. In the embodiment, although in order for a positional relationship to be indicated, a portion shown in the lower side of FIG. 1 may be expressed as "down", and a portion shown in the upper side of FIG. 1 may be expressed as "up", this expression is made for convenience, and this differs from the up and down direction determined by the direction of gravitational force.

In the description, a "barrier layer" indicates a layer that is sandwiched between well layers. A layer that is not sandwiched between well layers is referred to as the "first barrier layer" or the "last barrier layer", and the reference thereof is different from the layer that is sandwiched between well layers.

In the description, a term "dopant concentration" and a term "carrier concentration" that is the concentration of electrons and holes produced as an n-type dopant or a p-type dopant is subjected to doping are used, and the relationship thereof will be described later.

A "carrier gas" is a gas other than a III raw gas, a V raw gas and a dopant raw gas. The atoms of the carrier gas are not incorporated into a film or the like.

An "n-type nitride semiconductor layer" may contain an n-type layer or an undoped layer which has such a thickness that the flow of electrons is not practically prevented and which has a low carrier concentration. A "p-type nitride semiconductor layer" may also contain a p-type layer or an undoped layer which has such a thickness that the flow of holes is not practically prevented and which has a low carrier concentration. The "not practically prevented" means that the operating voltage of the nitride semiconductor light emitting element is a practical level.

The present invention is not limited to the embodiment described below. Furthermore, in the drawings of the present invention, the relationship of dimensions such as a length, a width and a thickness is changed as necessary for clarification and simplification of the drawings, and is not the actual relationship of the dimensions.

Figure 2:
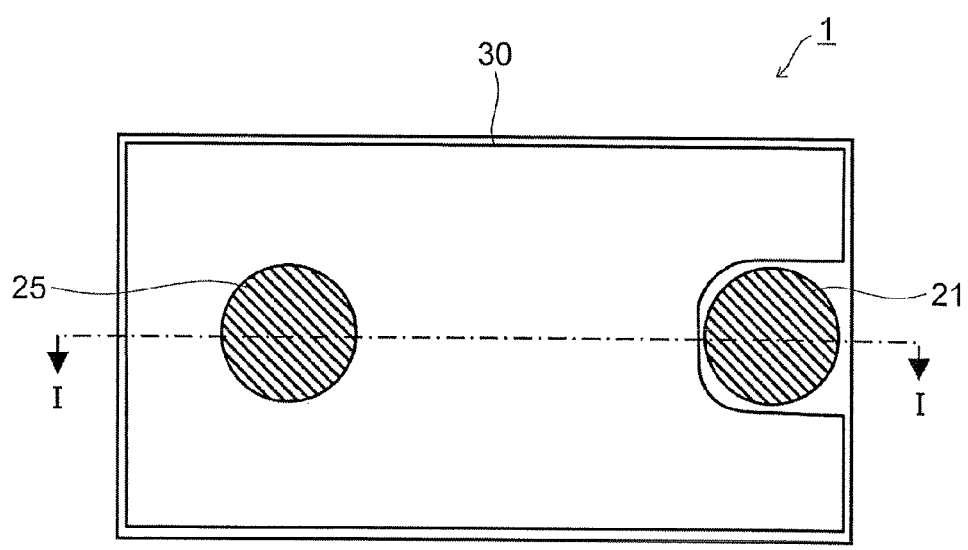
FIG. 2 A schematic plan view of the nitride semiconductor light emitting element according to the embodiment of the present invention.
Figure 3:
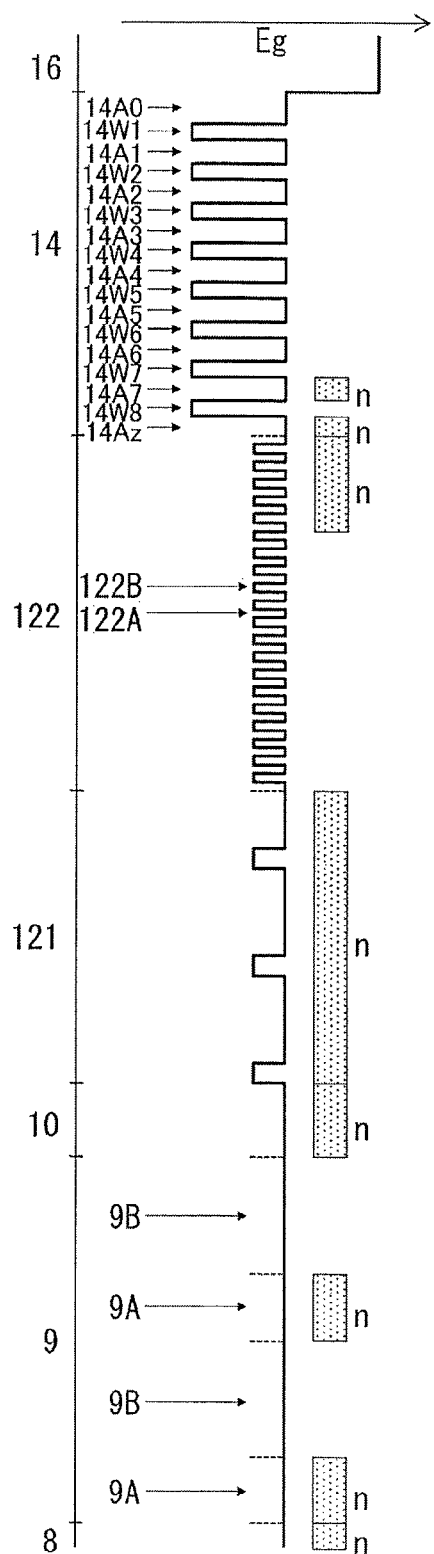
FIG. 3 An illustrative diagram schematically showing the sizes of the band gap energies Eg in the nitride semiconductor layers of the nitride semiconductor light emitting element according to the present invention.

FIGS. 1 and 2 are respectively a schematic cross-sectional view and a schematic plan view of a nitride semiconductor light emitting element 1 according to the embodiment of the present invention. A cross-sectional view taken along line I-I shown in FIG. 2 corresponds to FIG. 1. FIG. 3 is an illustrative diagram schematically showing the magnitude of band gap energies Eg from a lower n-type nitride semiconductor layer 8 to a p-type nitride semiconductor layer 16 in the nitride semiconductor light emitting element 1 shown in FIG. 1. The vertical axis direction of FIG. 3 represents the up/down direction of the nitride semiconductor light emitting element 1 shown in FIG. 1, and Eg in the horizontal axis of FIG. 3 schematically represents the magnitude of a band gap energy in each layer. In FIG. 3, on the right side of layers that are doped with an n-type dopant, "n" with hatching is shown.

In the nitride semiconductor light emitting element 1 according to the present embodiment, as shown in FIG. 1, on the upper surface of a substrate 3, a buffer layer 5, a foundation layer 7 formed with a first nitride semiconductor foundation layer 7a and a second nitride semiconductor foundation layer 7b, the lower n-type nitride semiconductor layer 8, an n-type nitride semiconductor modulation doped layer 9, a low-temperature n-type nitride semiconductor layer (V pit generation layer) 10, a multilayer structure member 121, a superlattice layer 122 that is an intermediate layer, a MQW light emitting layer 14 and p-type nitride semiconductor layers 16, 17 and 18 are formed by being deposited in this order.

Part of the lower n-type nitride semiconductor layer 8, the n-type nitride semiconductor modulation doped layer 9, the low-temperature n-type nitride semiconductor layer (V pit generation layer) 10, the multilayer structure member 121, the superlattice layer 122 that is the intermediate layer, the MQW light emitting layer 14 and the p-type nitride semiconductor layers 16, 17 and 18 are etched to form a mesa portion 30. The mesa portion 30 protrudes upward with respect to the lower n-type nitride semiconductor layer 8. On the p-type nitride semiconductor layer 18, a p-side electrode 25 is provided through a transparent electrode 23.

Outside the mesa portion 30 (on the right side of FIG. 1), part of the upper surface of the lower n-type nitride semiconductor layer 8 is exposed without being covered with the n-type nitride semiconductor modulation doped layer 9, the low-temperature n-type nitride semiconductor layer (V pit generation layer) 10, the multilayer structure member 121, the superlattice layer 122 that is the intermediate layer and the like. On the exposed part, an n-side electrode 21 is provided.

On the substantially entire upper surface of the nitride semiconductor light emitting element 1, a transparent protective film 27 is provided such that the p-side electrode 25 and the n-side electrode 21 are exposed.

It is found by cross section ultra-high magnification STEM (scanning transmission electron microscopy) observation that in the nitride semiconductor light emitting element 1, V pits 15 are inevitably generated. However, in the present embodiment, as will be described later, the low-temperature n-type nitride semiconductor layer (V pit generation layer) 10 is provided, and thus the generation of the V pits 15 is controlled.

The substrate 3 may be, for example, an insulating substrate such as sapphire or may be, for example, a conductive substrate such as GaN, SiC or ZnO. The thickness of the substrate 3 when the nitride semiconductor layer is grown is preferably, for example, 900 μm to 1200 μm, and the thickness of the substrate 3 in the nitride semiconductor light emitting element 1 is preferably, for example, equal to or more than 50 μm but equal to or less than 300 μm.

Figure 4:
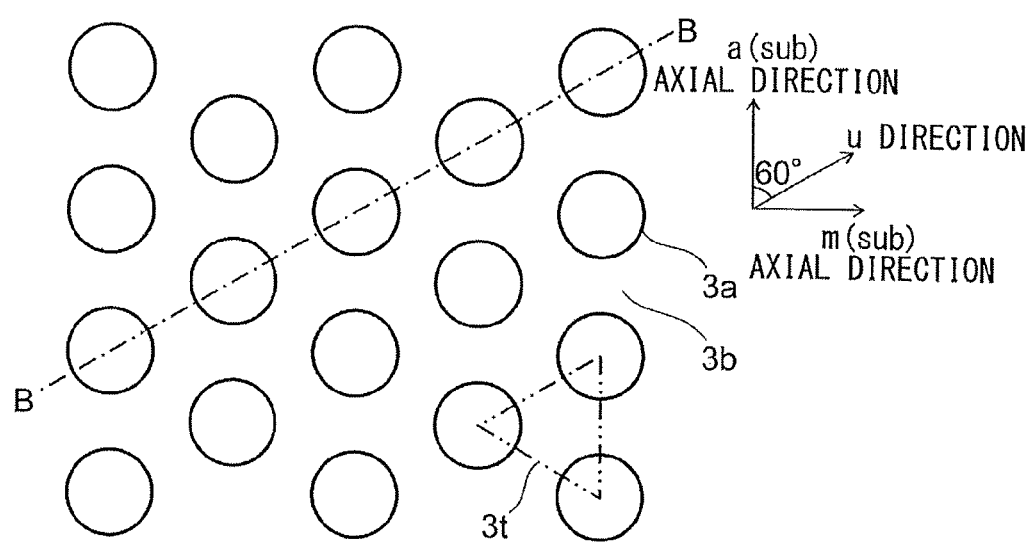
FIG. 4 An enlarged plan view schematically showing the surface of the substrate of the nitride semiconductor light emitting element in FIG. 1.

The upper surface of the substrate 3 has, as shown in FIG. 1, a concave-convex shape formed with convex portions 3A and concave portions 3B. The convex portion 3A is formed substantially in the shape of a circle provided on the apex of a substantially regular triangle in plan view (see FIG. 4). The distance between the apexes of the adjacent convex portions 3A is preferably 1 μm to 5 μm. Although the cross-sectional shape of the convex portion 3A may be trapezoidal (see FIG. 1), the apex portion thereof is more preferably rounded.

The substrate 3 is removed after the growth of the individual nitride semiconductor layers, and thus the nitride semiconductor light emitting element without the substrate may be obtained.

The buffer layer 5 is preferably, for example, an $Al_{s0}Ga_{t0}O_{u0}N_{1-u0}$ ($0 \leq s0 \leq 1$, $0 \leq t0 \leq 1$, $0 \leq u0 \leq 1$, $s0+t0 \neq 0$) layer, and is more preferably an AlN layer or an AlON layer. As the AlON layer, a very small part of N (0.5 to 2%) is preferably replaced by oxygen. In this way, since the buffer layer 5 is formed so as to extend in the direction of a normal to the growth surface of the substrate 3, it is possible to obtain the buffer layer 5 that is formed with an aggregation of columnar crystals having uniform crystal grains. Although the thickness of the buffer layer 5 is not particularly limited, the thickness is preferably equal to or more than 3 nm but equal to or less than 100 nm, and is more preferably equal to or more than 5 nm but equal to or less than 50 nm.

In order to enhance the X ray rocking curve half-value width of the foundation layer, which will be described later, as the buffer layer 5, AlON is preferably used by a known spattering method.

The foundation layer 7 is preferably formed with the first nitride semiconductor foundation layer 7a and the second nitride semiconductor foundation layer 7b. The first nitride semiconductor foundation layer 7a is formed on the concave portions 3b, and has, in the cross-sectional view shown in FIG. 1, a substantially triangular shape (diagonal facet plane 7a1). The second nitride semiconductor foundation layer 7b is formed so as to cover the convex portions 3a and the first nitride semiconductor foundation layer 7a, and is provided so as to be in contact with the surfaces of the buffer layer 5 and the first nitride semiconductor foundation layer 7a, and an upper surface 7b1 in contact with the lower n-type nitride semiconductor layer 8 is flat. Unless otherwise particularly limited in this description, the first nitride semiconductor foundation layer 7a and the second nitride semiconductor foundation layer 7b may be collectively referred to as the foundation layer 7.

As described above, the foundation layer 7 is divided into at least the two portions, that is, the first nitride semiconductor foundation layer 7a and the second nitride semiconductor foundation layer 7b, and thus it is possible to reduce the X ray half-value width, which is an index for the crystal quality of the foundation layer 7. The "diagonal facet plane" is a plane that is diagonal at an angle of at least 10 degrees or more with respect to at least the substrate surface and that extends in a diagonal direction, and is preferably substantially the same as the crystal plane of the nitride semiconductor.

The first nitride semiconductor foundation layer 7a and the second nitride semiconductor foundation layer 7b each can be formed sequentially by, for example, a MOCVD (metal organic chemical vapor deposition) method on the surface of the buffer layer 5. The first nitride semiconductor foundation layer 7a is grown in a facet growth mode in which the diagonal facet plane 7a1 is formed. The second nitride semiconductor foundation layer 7b is grown in an embedding growth mode in which the diagonal facet plane 7a1 is embedded to form the flat upper surface 7b1. In this way, it is possible to form the second nitride semiconductor foundation layer 7b that has the flat upper surface 7b1 where few crystal defects are produced and high crystallinity is achieved. The first nitride semiconductor foundation layer 7a has an upper surface 7a2.

As the first nitride semiconductor foundation layer 7a, for example, a layer that is formed with a III nitride semiconductor expressed by a formula of $Al_{x2}Ga_{y2}In_{z2}N$ ($0 \leq x2 \leq 1$, $0 \leq y2 \leq 1$, $0 \leq z2 \leq 1$, $x2+y2+z2 \neq 0$) can be grown. As the second nitride semiconductor foundation layer 7b, for example, a layer that is formed with a III nitride semiconductor expressed by a formula of $Al_{x3}Ga_{y3}In_{z3}N$ ($0 \leq x3 \leq 1$, $0 \leq y3 \leq 1$, $0 \leq z3 \leq 1$, $x3+y3+z3 \neq 0$) can be grown.

As each of the first nitride semiconductor foundation layer 7a and the second nitride semiconductor foundation layer 7b, a nitride semiconductor layer containing Ga as a III element is preferably used so that crystal defects such as dislocations within the buffer layer 5 formed with an aggregation of columnar crystal are not received.

Although it is necessary to loop dislocations in the vicinity of an interface with the buffer layer 5 so that the dislocations within the buffer layer 5 are not received, when the first nitride semiconductor foundation layer 7a is formed with a III nitride semiconductor containing Ga, the loop of dislocations is easily produced. Hence, the first nitride semiconductor foundation layer 7a formed with a III nitride semiconductor containing Ga and the second nitride semiconductor foundation layer 7b containing Ga are used. In this way, in the vicinity of the interface with the buffer layer 5, dislocations are looped and confined, and thus it is possible to reduce the reception of the dislocations by the first nitride semiconductor foundation layer 7a from the buffer layer 5.

For example, when the first nitride semiconductor foundation layer 7a is formed with a III nitride semiconductor expressed by a formula of $Al_{x2}Ga_{y2}N$ ($0 \leq x2 \leq 1$, $0 \leq y2 \leq 1$), and the second nitride semiconductor foundation layer 7b is formed with a III nitride semiconductor expressed by a formula of $Al_{x3}Ga_{y3}N$ ($0 \leq x3 \leq 1$, $0 < y3 < 1$), especially when each of the first nitride semiconductor foundation layer 7a and the second nitride semiconductor foundation layer 7b is formed with GaN, it is possible to loop and confine dislocations in the vicinity of the interface with the buffer layer 5. Thus, it is possible to obtain the first nitride semiconductor foundation layer 7a and the second nitride semiconductor foundation layer 7b in which the dislocation density is low and satisfactory crystallinity is achieved.

The first nitride semiconductor foundation layer 7a and the second nitride semiconductor foundation layer 7b may be doped with, for example, an n-type dopant in a range equal to or more than $1 \times 10^{17}$ cm$^{-3}$ but equal to or less than $1 \times 10^{19}$ cm$^{-3}$. However, in terms of maintaining satisfactory crystallinity, the first nitride semiconductor foundation layer 7a and the second nitride semiconductor foundation layer 7b are preferably undoped.

As the n-type dopant with which the first nitride semiconductor foundation layer 7a and the second nitride semiconductor foundation layer 7b are doped, it is possible to use, for example, at least one selected from a group consisting of Si, Ge and Sn, and in particular, Si is preferably used. When Si is used as the n-type dopant, silane or disilane is preferably used as an n-type doping gas.

The temperature of the substrate 1 when the first nitride semiconductor foundation layer 7a and the second nitride semiconductor foundation layer 7b are grown is preferably equal to or more than 800° C. but equal to or less than 1250° C., and is more preferably equal to or more than 900° C. but equal to or less than 1150° C. When the temperature of the substrate 1 when the first nitride semiconductor foundation layer 7a and the second nitride semiconductor foundation layer 7b are grown is equal to or more than 800° C. but equal to or less than 1250° C., especially when it is equal to or more than 900° C. but equal to or less than 1150° C., it is possible to grow the first nitride semiconductor foundation layer 7a and the second nitride semiconductor foundation layer 7b in which few crystal defects are produced and excellent crystallinity is achieved.

Although the thickness of the foundation layer 7 is increased as much as possible to reduce defects within the foundation layer 7, even if the thickness of the foundation layer 7 is increased beyond a certain degree, the effect of reducing defects in the foundation layer 7 is saturated. Hence, the thickness of the foundation layer 7 is preferably equal to or more than 1 μm but equal to or less than 8 μm, and is more preferably equal to or more than 3 μm but equal to or less than 5 μm.

In the present embodiment, the n-type nitride semiconductor layer (including an undoped layer and a low carrier density layer) is formed with the lower n-type nitride semiconductor layer 8 (8a, 8b), the n-type nitride semiconductor modulation doped layer 9, the low-temperature n-type nitride semiconductor layer (V pit generation layer) 10, the multilayer structure member 121 and the intermediate layer (superlattice layer) 122.

The lower n-type nitride semiconductor layer 8, for example, is preferably a layer in which an $Al_{s2}Ga_{t2}In_{u2}N$ ($0 \le s2 \le 1$, $0 \le t2 \le 1$, $0 \le u2 \le 1$, $s2+t2+u2 \approx 1$) layer is doped with an n-type dopant, and is more preferably a layer in which an $Al_{s2}Ga_{1-s2}N$ ($0 \le s2 \le 1$, preferably $0 \le s2 \le 0.5$ and more preferably $0 \le s2 \le 0.1$) layer is doped with an n-type dopant.

Although in the lower n-type nitride semiconductor layer 8, the n-type dopant is not particularly limited, it may be Si, P, As, Sb or the like, and is preferably Si. The same is true for the layers that will be described later. Although the n-type dopant concentration is not particularly limited, $1 \times 10^{19}$ cm$^{-3}$ or less is preferable.

The more the thickness of the lower n-type nitride semiconductor layer 8 is increased, the more the resistance of the lower n-type nitride semiconductor layer 8 is decreased. However, the thickness of the lower n-type nitride semiconductor layer 8 is increased, and thus the manufacturing cost of the nitride semiconductor light emitting element is increased. In consideration with both facts, the thickness of the lower n-type nitride semiconductor layer 8 is preferably and practically equal to or more than 1 μM but equal to or less than 10 μM; however, it is not particularly limited.

In Examples that will be described later, in two growth steps in which the growth of an n-type GaN layer (lower n-type nitride semiconductor layer 8a) is temporarily stopped and then the same n-type GaN layer (lower n-type nitride semiconductor layer 8b) is grown again, the lower n-type nitride semiconductor layer 8 is formed. However, the configuration of the lower n-type nitride semiconductor layer 8 is not particularly limited. For example, the lower n-type nitride semiconductor layer 8 may be formed into a single layer by continuously forming the lower n-type nitride semiconductor layer 8a and the lower n-type nitride semiconductor layer 8b or the lower n-type nitride semiconductor layer 8 may have a multi-layer deposition structure of three or more layers. In the lower n-type nitride semiconductor layer 8 formed with a plurality of layers, the individual layers may be formed to have the same composition or may be formed to have different compositions. In the lower n-type nitride semiconductor layer 8 formed with a plurality of layers, the individual layers may have the same thickness or may have different thicknesses.

The n-type nitride semiconductor modulation doped layer 9 is deposited on the lower n-type nitride semiconductor layer 8 by, for example, a MOCVD method. As shown in FIG. 3, the n-type nitride semiconductor modulation doped layer 9 is formed with a multi-layer deposition member in which an n-type GaN layer 9A and a GaN layer 9B where the n-type dopant concentration is lower than that of the n-type GaN layer 9A are alternately deposited, and can be formed by depositing the GaN layer 9B on the uppermost layer adjacent to the low-temperature n-type nitride semiconductor layer (V pit generation layer) 10.

The n-type dopant concentration of the n-type GaN layer 9A can be set at, for example, $1 \times 10^{19}$ cm$^{-3}$ or more. Although the n-type dopant is not particularly limited, Si, P, As, Sb or the like may be used, and Si is preferably used.

As the GaN layer 9B, a GaN layer where the n-type dopant concentration is lower than that of the n-type GaN layer 9A, for example, a GaN layer of $3 \times 10^{18}$ cm$^{-3}$ or less can be used. In particular, an undoped GaN layer is preferably used.

The number of layers deposited as the n-type GaN layer 9A and the GaN layer 9B is not particularly limited. For example, three or two combinations of the n-type GaN layer 9A and the GaN layer 9B may be deposited. Only one layer GaN layer 9B may be provided.

The thickness of the n-type GaN layer 9A can be set, for example, equal to or more than 5 nm but equal to or less than 500 nm. The thickness of the GaN layer 9B can be set, for example, equal to or more than 5 nm but equal to or less than 500 nm.

Each of the n-type GaN layer 9A and the GaN layer 9B may be formed of $Al_{s3}Ga_{t3}In_{u3}N$ ($0 \le s3 \le 1$, $0 \le t3 \le 1$, $0 \le u3 \le 1$, $s3+t3+u3 \approx 1$).

The n-type GaN layer 9A and the GaN layer 9B are preferably formed at the same temperature as the lower n-type nitride semiconductor layer 8. The n-type dopant concentration of the n-type GaN layer 9A is preferably equal to that of the low-temperature n-type nitride semiconductor layer (V pit generation layer) 10. Thus, it is possible to obtain the effect of increasing the size of the V pits 15 generated in the low-temperature n-type nitride semiconductor layer (V pit generation layer) 10. In this way, it is possible to further reduce the increase in failure rate caused by ESD (electro-static discharge).

The low-temperature n-type nitride semiconductor layer (V pit generation layer) 10 is a layer for forming the V pits 15 such that the average position of the starting points of the V pits 15 is located within a layer (in the present embodiment, the intermediate layer (superlattice layer) 122) located on the side of the n-type nitride semiconductor modulation doped layer 9 as compared with a layer (in the present embodiment, the MQW light emitting layer 14) which effectively functions as the light emitting layer. Here, the starting point of the V pit 15 means the bottom portion of the V pit 15 (the lowermost end portion in FIG. 1). The average position of the starting points of the V pits 15 means a position that can be obtained by averaging the starting points of the V pits 15 formed in the MQW light emitting layer 14 in the direction of the thickness of the nitride semiconductor light emitting element 1 (the up/down direction in FIG. 1). The meaning of the "low-temperature" will be described later.

The low-temperature n-type nitride semiconductor layer (V pit generation layer) 10 is, for example, a highly doped n-type GaN layer having a thickness of 25 nm. Here, the "highly doped" means that the n-type dopant concentration is significantly (for example, 1.1 times or more, preferably 1.4 times or more and more preferably 1.8 times or more as high as) higher than those of the lower n-type nitride semiconductor layer 8 and the n-type nitride semiconductor modulation doped layer 9. Specifically, the n-type dopant concentration of the low-temperature n-type nitride semiconductor layer (V pit generation layer) 10 is preferably $5 \times 10^{18}$ cm$^{-3}$ or more, is more preferably $7 \times 10^{18}$ cm$^{-3}$ or more and is further preferably $1 \times 10^{19}$ cm$^{-3}$ or more. In this way, since the film quality of the low-temperature n-type nitride semiconductor layer (V pit generation layer) 10 is lower than the film quality of the n-type nitride semiconductor modulation doped layer 9, it is possible to effectively achieve the effect of generating V pits by the low-temperature n-type nitride semiconductor layer (V pit generation layer) 10.

On the other hand, when the n-type dopant concentration of the low-temperature n-type nitride semiconductor layer (V pit generation layer) 10 is excessively increased, the luminous efficiency of the MQW light emitting layer 14 formed on the low-temperature n-type nitride semiconductor layer (V pit generation layer) 10 may be lowered. Hence, the n-type dopant concentration of the low-temperature n-type nitride semiconductor layer (V pit generation layer) 10 is preferably 10 times or less as high as that of the n-type nitride semiconductor modulation doped layer 9, and is more preferably 3 times or less as high as that thereof.

Preferably, the n-type dopant concentration of the low-temperature n-type nitride semiconductor layer (V pit generation layer) 10 is significantly (for example, 1.1 times or more, preferably 1.4 times or more and more preferably 1.8 times or more as high as) higher than that of the uppermost surface of the n-type nitride semiconductor modulation doped layer 9. In this way, it is possible to effectively achieve the effect of generating V pits by the low-temperature n-type nitride semiconductor layer (V pit generation layer) 10.

The low-temperature n-type nitride semiconductor layer (V pit generation layer) 10 may be a layer in which an $Al_{s3}Ga_{t3}In_{u3}N$ ($0 \leq s3 \leq 1$, $0 \leq t3 \leq 1$, $0 \leq u3 \leq 1$, $s3+t3+u3 \approx 1$) layer is doped with an n-type dopant, and is preferably a layer in which an $In_{u3}Ga_{t-u3}N$ ($0 \leq u3 \leq 1$, preferably $0 \leq u3 \leq 0.5$ and more preferably $0 \leq u3 \leq 0.15$) layer is doped with an n-type dopant. As described above, when the low-temperature n-type nitride semiconductor layer (V pit generation layer) 10 contains In, the In composition ratio in the low-temperature n-type nitride semiconductor layer (V pit generation layer) 10 is preferably higher than the In composition ratio in the n-type nitride semiconductor modulation doped layer 9. In this way, since the film quality of the low-temperature n-type nitride semiconductor layer (V pit generation layer) 10 is also degraded as compared with the film quality of the n-type nitride semiconductor modulation doped layer 9, it is possible to effectively achieve the effect of generating V pits by the low-temperature n-type nitride semiconductor layer (V pit generation layer) 10.

The low-temperature n-type nitride semiconductor layer (V pit generation layer) 10 described above preferably has a thickness of 5 nm or more, and more preferably has a thickness of 10 nm or more. In this way, it is possible to obtain the effect of increasing the number of V pits per unit number of threading dislocations In the nitride semiconductor light emitting element 1, the starting point of the V pit 15 is located lower than the MQW light emitting layer 14 in FIG. 1. In this way, as will be described later, the number of undoped barrier layers of the MQW light emitting layer 14 is increased, and thus it is possible to increase the volume of the MQW light emitting layer 14, which contributes to light emission. Hence, it is possible to reduce the decrease in luminous efficiency at the time of drive with a high current, and it is also possible to reduce the decrease in luminous efficiency at the time of drive at a high temperature. However, it is found that when the number of undoped barrier layers of the MQW light emitting layer 14 is increased, and thus the volume of the MQW light emitting layer 14, which contributes to light emission is increased, the failure rate caused by ESD is increased.

On the other hand, when the number of undoped barrier layers of the MQW light emitting layer 14 is increased, the distance between the low-temperature n-type nitride semiconductor layer (V pit generation layer) 10 and the MQW light emitting layer 14, which contributes to light emission is reduced. Consequently, it is undesirable that the starting points of the V pits 15 are located close to the MQW light emitting layer 14, which contributes to light emission. In order to prevent the average position of the starting points of the V pits 15 from being present within the MQW light emitting layer 14 (at least the upper portion of the MQW light emitting layer 14), it is preferable to separate the low-temperature n-type nitride semiconductor layer (V pit generation layer) 10 from the MQW light emitting layer 14 as much as possible. However, when in order for this purpose to be achieved, the thickness of the intermediate layer (superlattice layer) 122 present between the MQW light emitting layer 14 and the low-temperature n-type nitride semiconductor layer (V pit generation layer) 10 is increased, the quality of the MQW light emitting layer 14 may be degraded. This may also cause the productivity of the nitride semiconductor light emitting element 1 to be lowered.

When in order for the low-temperature n-type nitride semiconductor layer (V pit generation layer) 10 to be separated from the MQW light emitting layer 14 as much as possible, between the low-temperature n-type nitride semiconductor layer (V pit generation layer) 10 and the intermediate layer (superlattice layer) 122, only an n-type GaN layer was formed to have a large thickness at a temperature equal to or less than the growth temperature of the low-temperature n-type nitride semiconductor layer (V pit generation layer) 10, the decrease in luminous efficiency at the time of drive at a high temperature and at the time of drive with a high current was not prevented from being lowered, and the failure rate caused by ESD was increased. This is probably because when an n-type GaN layer is formed to have a large thickness (for example, 200 nm or more) at a temperature equal to or less than the growth temperature of the low-temperature n-type nitride semiconductor layer (V pit generation layer) 10, the growth surface of the n-type GaN layer has a concave-convex shape (the growth surface of the n-type GaN layer has white turbidity), and this adversely affects the layer formed on the n-type GaN layer.

The multilayer structure member 121 is formed between the low-temperature n-type nitride semiconductor layer (V pit generation layer) 10 and the intermediate layer (superlattice layer) 122, and thus it is possible to reduce the decrease in luminous efficiency at the time of drive at a high temperature and at the time of drive with a high current, and furthermore it is possible to reduce the failure rate caused by ESD. Then, the configuration of the multilayer structure member 121 will be described.

Preferably, the multilayer structure member 121 is formed by depositing a plurality of nitride semiconductor layers having different band gap energies, and for adjacent other nitride semiconductor layers, a nitride semiconductor layer having a relatively low band gap energy and a nitride semiconductor layer having a relatively high band gap energy are alternately deposited. Thus, it is possible to increase the size of the V pits 15 generated in the low-temperature n-type nitride semiconductor layer (V pit generation layer) 10. Consequently, it is possible to obtain the effect of increasing the size of the intermediate layer 122 and the MQW light emitting layer 14 thereon. It is therefore possible to reduce the increase in failure rate caused by ESD. The thickness of each of the layers of the multilayer structure member 121 is preferably larger than that of each of the layers of the intermediate layer (superlattice layer) 122.

The n-type dopant concentration of each of the nitride semiconductor layers of the multilayer structure member 121 is preferably set lower than the n-type dopant concentration of the low-temperature n-type nitride semiconductor layer (V pit generation layer) 10, and is preferably, for example, $7\times10^{17}$ cm$^{-3}$ or less. As described above, the n-type dopant concentration in the multilayer structure member 121 is low, and thus a depletion layer is widened at the time of reverse bias. In this way, the multilayer structure member 121 can be made to also function as an electric field relaxation layer together with the intermediate layer (superlattice layer) 122. The drive voltage of the nitride semiconductor light emitting element 1 does not exceed the allowable range, and thus it is possible to form the nitride semiconductor layers of the multilayer structure member 121 into undoped layers.

The multilayer structure member 121 is preferably formed at a temperature equal to or less than the growth temperature of the low-temperature n-type nitride semiconductor layer (V pit generation layer) 10, and is more preferably formed at a temperature of 900° C. or less. In this way, it is possible to obtain the effect of increasing the size of the V pits 15 generated in the low-temperature n-type nitride semiconductor layer (V pit generation layer) 10. On the other hand, when the growth temperature of the multilayer structure member 121 is excessively low, the quality of the film of the multilayer structure member 121 may be degraded. Hence, the growth temperature of the multilayer structure member 121 is preferably equal to or more than 600° C. and is further preferably equal to or more than 700° C.

The reason why it is necessary to use the nitride semiconductor layer (for example, an InGaN layer or an n-type InGaN layer) having a relatively low band gap energy for the two adjacent layers of a plurality of nitride semiconductor layers in the multilayer structure member 121 is not clear; however, the following reason can be considered. When at a temperature equal to or less than the growth temperature of the low-temperature n-type nitride semiconductor layer (V pit generation layer) 10, in the middle of the growth of a nitride semiconductor layer (for example, a GaN layer or an n-type GaN layer) having a relatively high band gap energy, a nitride semiconductor layer having a relatively low band gap energy is grown, the two-dimensional growth of the nitride semiconductor layer having a relatively high band gap energy is facilitated. Consequently, even if the total thickness of the multilayer structure member 121 is large, it is possible to prevent an adverse effect caused by the large total thickness from being produced on a layer grown on the multilayer structure member 121.

In order for such an effect to be effectively obtained, for the two adjacent layers of a plurality of nitride semiconductor layers in the multilayer structure member 121, the thickness of the nitride semiconductor layer having a relatively low band gap energy is preferably smaller than that of the nitride semiconductor layer having a relatively high band gap energy, and is preferably 1/5 times or more but 1/2 times or less as large as that of the nitride semiconductor layer having a relatively high band gap energy. The thickness of the nitride semiconductor layer having a relatively high band gap energy is preferably equal to or more than 5 nm but equal to or less than 100 nm, and is more preferably equal to or more than 10 nm but equal to or less than 40 nm.

As an example of the multilayer structure member 121, there is a multilayer structure member in which on the low-temperature n-type nitride semiconductor layer (V pit generation layer) 10, an n-type InGaN layer having a thickness of 7 nm, an n-type GaN layer having a thickness of 30 nm, an n-type InGaN layer having a thickness of 7 nm and an n-type GaN layer having a thickness of 20 nm are sequentially deposited.

The specific composition of the nitride semiconductor layers of the multilayer structure member 121 is not limited to the composition described above. For example, as the nitride semiconductor layer having a relatively high band gap energy in the multilayer structure member 121, there is an $Al_{i1}Ga_{j1}In_{(1-i1-j1)}N$ ($0 \leq i1 < 1$, $0 < j1 \leq 1$) layer, and a GaN layer is preferably used. As the nitride semiconductor layer having a relatively low band gap energy in the multilayer structure member 121, there is an $Al_{i2}Ga_{j2}In_{(1-i2-j2)}N$ ($0 \leq i2 < 1$, $0 \leq j2 < 1$, $j1 < j2$) layer, and a $Ga_{j3}In_{(1-j3)}N$ ($0 < j3 < 1$) layer is preferably used.

More specifically, the multilayer structure member 121 may be formed by alternately depositing the $Al_{i1}Ga_{j1}In_{(1-i1-j1)}N$ ($0 \leq i1 < 1$, $0 < j1 \leq 1$) layer and the $Al_{i2}Ga_{j2}In_{(1-i2-j2)}N$ ($0 \leq i2 < 1$, $0 \leq j2 < 1$, $j1 < j2$) layer or may be formed by alternately depositing a GaN layer and the $Ga_{j3}In_{(1-j3)}N$ ($0 < j3 < 1$) layer.

Preferably, when the nitride semiconductor layer of the multilayer structure member 121 contains In, the In composition ratio in the nitride semiconductor layer of the multilayer structure member 121 is substantially (±5%) equal to the In composition ratio in the intermediate layer (superlattice layer) 122. In this way, when the intermediate layer (superlattice layer) 122 is formed after the multilayer structure member 121, it is possible to omit a bothersome step of changing the amount of raw gas of In supplied. Hence, the productivity of the nitride semiconductor light emitting element 1 is enhanced. More preferably, when the nitride semiconductor layer of the multilayer structure member 121 is the $Ga_{j3}In_{(1-j3)}N$ (0<j3<1) layer, the In composition ratio (1-j3) in the $Ga_{j3}In_{(1-j3)}N$ (0<j3<1) layer is equal to the In composition ratio in a narrow band gap layer 122B (which will be described later) of the intermediate layer (superlattice layer) 122.

For the two adjacent layers of a plurality of nitride semiconductor layers in the multilayer structure member 121, the number of nitride semiconductor layers having a relatively low band gap energy and the number of nitride semiconductor layers having a relatively high band gap energy are not particularly limited. Preferably, when the nitride semiconductor layer having a relatively low band gap energy and the nitride semiconductor layer having a relatively high band gap energy are assumed to be one pair, the multilayer structure member 121 includes two or more pairs of the nitride semiconductor layer having a relatively low band gap energy and the nitride semiconductor layer having a relatively high band gap energy. Thus, it is possible to increase the thickness of the multilayer structure member 121. Hence, in the average position of the starting points of the V pits 15, many of them are located on the side of the substrate 3 with respect to the vicinity of the center in the direction of the thickness of the intermediate layer (superlattice layer) 122. Consequently, it is possible to further reduce the decrease in luminous efficiency at the time of drive at a high temperature or at the time of drive with a high current.

As described above, the multilayer structure member 121 is introduced between the low-temperature n-type nitride semiconductor layer (V pit generation layer) 10 and the intermediate layer (superlattice layer) 122, and thus it is possible to form the low-temperature n-type nitride semiconductor layer (V pit generation layer) 10 such that the low-temperature n-type nitride semiconductor layer (V pit generation layer) 10 is further separated from the MQW light emitting layer 14. In this way, the average position of the starting points of the V pits 15 is located within the intermediate layer (superlattice layer) 122, and many of them may be located on the side of the substrate 3 with respect to the vicinity of the center in the direction of the thickness of the intermediate layer (superlattice layer) 122. Hence, it is possible to further reduce the decrease in luminous efficiency at the time of drive at a high temperature or at the time of drive with a high current.

Furthermore, the multilayer structure member 121 is formed by depositing a plurality of nitride semiconductor layers, and for the adjacent other nitride semiconductor layers, the nitride semiconductor layer having a relatively low band gap energy and the nitride semiconductor layer having a relatively high band gap energy are alternately deposited. In this way, it is possible to obtain the effect of increasing the size of the V pits 15 generated in the low-temperature n-type nitride semiconductor layer (V pit generation layer) 10. Hence, it is possible to reduce the increase in failure rate caused by ESD.

Between the low-temperature n-type nitride semiconductor layer (V pit generation layer) 10 and the MQW light emitting layer 14, the intermediate layer (superlattice layer) 122 is provided. The main function of the intermediate layer (superlattice layer) 122 is to leave a predetermined distance between the low-temperature n-type nitride semiconductor layer (V pit generation layer) 10 and the MQW light emitting layer 14 and to place the starting points of the V pits 15 on the lower side within the MQW light emitting layer 14 or within the intermediate layer (superlattice layer) 122. The intermediate layer (superlattice layer) 122 may be formed with a single layer or two or three layers.

The "superlattice layer" described here means a layer whose periodic structure is formed with a crystal lattice longer than a basic unit lattice by alternately depositing very thin crystal layers. As shown in FIG. 3, the intermediate layer (superlattice layer) 122 is formed by depositing a plurality of nitride semiconductor layers, and the superlattice structure is formed by alternately depositing, for the adjacent other nitride semiconductor layers, a wide band gap layer 122A having a relatively high band gap energy and a narrow band gap layer 122B having a relatively low band gap energy. The periodic structure of the intermediate layer (superlattice layer) 122 is longer than the basic unit lattice of the semiconductor material of the wide band gap layer 122A and the basic unit lattice of the semiconductor material of the narrow band gap layer 122B.

The intermediate layer (superlattice layer) 122 may have a superlattice structure that is formed by sequentially depositing one or more semiconductor layers different from the wide band gap layer 122A and the narrow band gap layer 122B, the wide band gap layer 122A and the narrow band gap layer 122B. The length of one period of the intermediate layer (superlattice layer) 122 (the total of the thickness of the wide band gap layer 122A and the thickness of the narrow band gap layer 122B) is shorter than the length of one period of the MQW light emitting layer 14, which will be described later; specifically, it is preferably equal to or more than 1 nm but equal to or less than 10 nm.

Each wide band gap layer 122A is preferably, for example, an $Al_{a1}Ga_{b1}In_{(1-a1-b1)}N$ (0≤a1≤1, 0<b1≤1) layer, and is more preferably a GaN layer. In each narrow band gap layer 122B, for example, its band gap is smaller than that of the wide band gap layer 122A, and is larger than that of each well layer 14W, which will be described later. The narrow band gap layer 122B is preferably an $Al_{a2}Ga_{b2}In_{(1-a2-b2)}N$ (0≤a2<1, 0<b2<1, (1-a1-b1)<(1-a2-b2)) layer, and is more preferably a $Ga_{b2}In_{(1-b2)}N$ (0<b2<1) layer.

At least one of the wide band gap layer 122A and the narrow band gap layer 122B preferably contains an n-type dopant. This is because when both the wide band gap layer 122A and the narrow band gap layer 122B are undoped, the drive voltage is increased. In this case, the n-type dopant concentration can be set at, for example, $1\times10^{19}$ cm$^{-3}$ or more. Although the n-type dopant is not particularly limited, Si, P, As, Sb or the like may be used, and Si is preferably used.

When all the nitride semiconductor layers of the intermediate layer (superlattice layer) 122 contain an n-type dopant, a depletion layer is not widen at the time of reverse bias, and electrons are prevented from passing through the intermediate layer (superlattice layer) 122. Hence, the effect of electric field relaxation is degraded. However, the intermediate layer (superlattice layer) 122 is also a layer which is provided such that electrons are injected into the MQW light emitting layer 14. Hence, at least two nitride semiconductor layers located on the side of the MQW light emitting layer 14 are set at n-type semiconductor layers, and a nitride semiconductor layer located on the side of the substrate 3 with respect to the n-type semiconductor layers is set at an undoped layer, and thus it is possible to increase the number of electrons injected into the MQW light emitting layer 14. In this way, the light output is enhanced, and the voltage reduction effect is achieved. When the thickness of the undoped layer is increased, it is necessary to apply a voltage due to the movement of electrons, with the result that the drive voltage may be increased. In order to reduce the increase in the drive voltage, it is preferable to set at least two nitride semiconductor layers located on the side of the substrate 3 at undoped layers.

When the wide band gap layer 122A and the narrow band gap layer 122B are assumed to be one pair, the intermediate layer (superlattice layer) 122 preferably has 20 or more pairs of the wide band gap layer 122A and the narrow band gap layer 122B. In this way, it is possible to form the low-temperature n-type nitride semiconductor layer (V pit generation layer) 10 such that the low-temperature n-type nitride semiconductor layer (V pit generation layer) 10 is further separated from the MQW light emitting layer 14. Hence, the average position of the starting points of the V pits 15 can be located within the intermediate layer (superlattice layer) 122.

When the intermediate layer (superlattice layer) 122 has 20 or more pairs of the wide band gap layer 122A and the narrow band gap layer 122B, 5 pairs of the wide band gap layer 122A and the narrow band gap layer 122B located on the side of the MQW light emitting layer 14 preferably contain an n-type dopant. In this way, it is possible to increase the number of electrons injected into the MQW light emitting layer 14. Hence, the light output is enhanced, and the voltage reduction effect is achieved.

When the intermediate layer (superlattice layer) 122 has a superlattice structure of undoped layers and a superlattice structure of n-type semiconductor layers, the intermediate layer (superlattice layer) 122 may be formed as follows: for example, 17 pairs of the wide band gap layer 122A and the narrow band gap layer 122B are deposited on the multilayer structure member 121 to form the superlattice structure of undoped layers, and thereafter 3 pairs of the wide band gap layer 122A containing an n-type dopant and the narrow band gap layer 122B containing an n-type dopant are deposited to form the superlattice structure of n-type semiconductor layers.

The intermediate layer (superlattice layer) 122 may be formed as follows: for example, on the multilayer structure member 121, 5 pairs of the wide band gap layer 122A containing an n-type dopant and the narrow band gap layer 122B containing an n-type dopant are deposited to form the superlattice structure of n-type semiconductor layers, then 10 pairs of the undoped wide band gap layer 122A and the undoped narrow band gap layer 122B are deposited to form the superlattice structure of undoped layers, and thereafter 5 pairs of the wide band gap layer 122A containing an n-type dopant and the narrow band gap layer 122B containing an n-type dopant are deposited to form the superlattice structure of n-type semiconductor layers.

The intermediate layer (superlattice layer) 122 is a layer that is provided in order to enhance the characteristics of the MQW light emitting layer 14 but is not a necessary configuration requirement for the nitride semiconductor light emitting element 1. However, the intermediate layer (superlattice layer) 122 is provided between the low-temperature n-type nitride semiconductor layer (V pit generation layer) 10 and the MQW light emitting layer 14, and thus it is possible to separate the low-temperature n-type nitride semiconductor layer (V pit generation layer) 10 from the MQW light emitting layer 14. In this way, it is possible to prevent the average position of the starting points of the V pits 15 from being present within the MQW light emitting layer 14 (at least in the upper portion of the MQW light emitting layer 14).

Hence, in the nitride semiconductor light emitting element 1, the intermediate layer (superlattice layer) 122 is preferably provided between the low-temperature n-type nitride semiconductor layer (V pit generation layer) 10 and the MQW light emitting layer 14. The thickness of the intermediate layer (superlattice layer) 122 is preferably equal to or more than 40 nm, is more preferably equal to or more than 50 nm and is further preferably equal to or more than 60 nm. On the other hand, since when the thickness of the intermediate layer (superlattice layer) 122 is excessively increased, the quality of the MQW light emitting layer 14 may be degraded, the thickness of the intermediate layer (superlattice layer) 122 is preferably equal to or less than 100 nm and is more preferably equal to or less than 80 nm.

The thickness of the wide band gap layer 122A containing an n-type dopant can be set, for example, equal to or more than 1 nm but equal to or less than 3 nm. The thickness of the narrow band gap layer 122B containing an n-type dopant can be set, for example, equal to or more than 1 nm but equal to or less than 3 nm.

In the MQW light emitting layer 14, the V pits 15 are partially formed. Here, that the V pits 15 are partially formed means that when the upper surface of the MQW light emitting layer 14 is observed by an AFM (atomic force microscope), the dotted V pits 15 are observed in the upper surface of the MQW light emitting layer 14. The density of the number of V pits in the upper surface of the MQW light emitting layer 14 is preferably equal to or more than $1 \times 10^8$ cm$^{-2}$ but equal to or less than $1 \times 10^{10}$ cm$^{-2}$. Although the V pits are conventionally formed in the MQW light emitting layer, the density of the number of V pits in the upper surface of the MQW light emitting layer is less than $1 \times 10^8$ cm$^{-2}$.

As shown in FIG. 3, the MQW light emitting layer 14 is formed as follows: a plurality of barrier layers 14A (14A1, 14A2, . . . and 14A7) are sandwiched by a plurality of well layers 14W (14W1, 14W2, . . . and 14W8) and the barrier layers 14A and the well layers 14W are alternately deposited. Immediately on the intermediate layer (superlattice layer) 122, the first barrier layer 14Az is provided. On the well layer 14W1 located closest to the side of the p-type nitride semiconductor layer 16 among the well layers 14W, the last barrier layer 14A0 is provided.

In the description, in order for the barrier layers 14A and the well layers 14W to be identified, numbers are added from the p-type nitride semiconductor layer 16 to the intermediate layer (superlattice layer) 122 such that, for example, the well layer 14W1, the barrier layer 14A1, the well layer 14W2, the barrier layer 14A2, . . . are shown. On the other hand, except the case where the barrier layers 14A and the well layers 14W are particularly and individually limited, they may be collectively referred to as the barrier layer 14A and the well layer 14W.

In the MQW light emitting layer 14, one or more semiconductor layers different from the barrier layer 14A and the well layer 14W, the barrier layer 14A and the well layer 14W may be sequentially deposited. The length of one period (the sum of the thickness of the barrier layer 14A and the thickness of the well layer 14W) of the MQW light emitting layer 14 is, for example, equal to or more than 5 nm but equal to or less than 100 nm.

The composition of each well layer 14W is preferably adjusted according to the light emission wavelength required for the nitride semiconductor light emitting element 1; for example, $Al_cGa_dIn_{(1-c-d)}N$ ($0 \leq c < 1$, $0 < d \leq 1$) may be used, and an $In_eGa_{(1-e)}N$ ($0 < e \leq 1$) layer excluding Al is preferably used. For example, when ultraviolet light having a wavelength of 375 nm or less is emitted, it is necessary to increase the band gap energy of the MQW light emitting layer 14, and the composition of each well layer 14W contains Al.

The compositions of the individual well layers 14W are preferably the same. Thus, the wavelengths of light emitted by the recombination of electrons and holes in each well layer 14W can be made equal to each other. Hence, it is possible to narrow the light mission spectrum width of the nitride semiconductor light emitting element 1.

The well layer 14W located on the side of the p-type nitride semiconductor layer 16 preferably excludes a dopant as much as possible. In other words, it is preferable to grow the well layer 14W located on the side of the p-type nitride semiconductor layer 16 without introducing dopant raw material. In this way, non-light emission recombination is unlikely to occur in the well layer 14W, and thus the luminous efficiency is made satisfactory.

On the other hand, the well layer 14W located on the side of the substrate 3 may contain an n-type dopant. Thus, the drive voltage of the nitride semiconductor light emitting element tends to be lowered.

Although the thicknesses of the well layers 14W are not particularly limited, they are preferably equal to each other. When the thicknesses of the well layers 14W are equal to each other, the quantum levels of the well layers 14W are equal to each other, and light having the same wavelength is generated in each well layer 14W by the recombination of electrons and holes in each well layer 14W. In this way, the light emission spectrum width of the nitride semiconductor light emitting element 1 is favorably narrowed.

On the other hand, the compositions and the thicknesses of the well layers 14W are intentionally made to differ from each other, and thus the light emission width of the nitride semiconductor light emitting element 1 can be made broad. Preferably, when the nitride semiconductor light emitting element 1 is used for applications such as illumination, the compositions and the thicknesses of the well layers 14W are intentionally made to differ from each other. For example, the thickness of each well layer 14W is preferably equal to or more than 1 nm but equal to or less than 7 nm. When the thickness of each well layer 14W falls outside this range, the luminous efficiency may be lowered.

The materials of the barrier layers 14A (14A1 to 14A7), the first barrier layer 14Az and the last barrier layer 14A0 preferably have a higher band gap energy than the materials of the well layers 14W. Specifically, the barrier layers 14A (14A1 to 14A7), the first barrier layer 14Az and the last barrier layer 14A0 are preferably formed of $Al_fGa_gIn_{(1-f-g)}N$ ($0 \le f<1$, $0<g \le 1$), is more preferably formed of $In_hGa_{(1-h)}N$ ($0<h \le 1$, $e>h$) excluding Al and is further preferably formed of $Al_fGa_gIn_{(1-f-g)}N$ ($0 \le f<1$, $0<g \le 1$) whose lattice constant is substantially equal to those of the materials of the well layer 14W.

Although the thickness of each barrier layer 14A is not particularly limited, it is preferably equal to or more than 1 nm but equal to or less than 10 nm, and is more preferably equal to or more than 3 nm but equal to or less than 7 nm. Although as the thickness of each barrier layer 14A is decreased, the drive voltage is lowered, the luminous efficiency tends to be lowered when the thickness of each barrier layer 14A is excessively decreased. Although the thickness of the first barrier layer 14Az is not particularly limited, it is preferably equal to or more than 1 nm but equal to or less than 10 nm. Although the thickness of the last barrier layer 14A0 is not particularly limited, it is preferably equal to or more than 1 nm but equal to or less than 40 nm.

The n-type dopant concentration of the barrier layers 14A (14A1 to 14A7) and the first barrier layer 14Az is not particularly limited, and is preferably set as necessary. Preferably, among a plurality of barrier layers 14A, the barrier layer 14A located on the side of the substrate 3 is doped with an n-type dopant, and the barrier layer 14A located on the side of the p-type nitride semiconductor layer 16 is doped with an n-type dopant whose concentration is lower than the barrier layer 14A located on the side of the substrate 3 or is not doped with an n-type dopant. The barrier layers 14A (14A1 to 14A7), the first barrier layer 14Az and the last barrier layer 14A0 may be intentionally doped with an n-type dopant. The barrier layers 14A (14A1 to 14A7), the first barrier layer 14Az and the last barrier layer 14A0 may be doped with a p-type dopant by thermal diffusion when the p-type nitride semiconductor layer 16, the p-type nitride semiconductor layer 17 and the p-type nitride semiconductor layer 18 are grown.

Although the number of well layers 14W is not particularly limited, for example, it is preferably equal to or more than 2 but equal to or less than 20, is more preferably equal to or more than 3 but equal to or less than 15 and is further preferably equal to or more than 4 but equal to or less than 12.

In the nitride semiconductor light emitting element 1, each of the p-type nitride semiconductor layers 16, 17 and 18 shown in FIG. 1 has a three-layer structure consisting of a p-type AlGaN layer, a p-type GaN layer and a high-concentration p-type GaN layer. However, this configuration is simply an example of the p-type nitride semiconductor layer. The p-type nitride semiconductor layers 16, 17 and 18 are preferably a layer in which, for example, an $Al_{s4}Ga_{t4}In_{u4}N$ ($0 \le s4 \le 1$, $0 \le t4 \le 1$, $0 \le u4 \le 1$, $s4+t4+u4 \ne 0$) layer is doped with a p-type dopant, and are more preferably a layer in which a $Al_{s4}Ga_{(1-s4)}N$ ($0<s4 \le 0.4$, and preferably $0.1 \le s4 \le 0.3$) layer is doped with a p-type dopant.

Although the p-type dopant is not particularly limited, for example, it is preferably magnesium. The carrier concentration of the p-type nitride semiconductor layers 16, 17 and 18 is preferably equal to or more than $1 \times 10^{17}$ cm$^{-3}$. Here, since the activity rate of the p-type dopant is about 0.01, the p-type dopant concentration (different from the carrier concentration) of the p-type nitride semiconductor layers 16, 17 and 18 is preferably equal to or more than $1 \times 10^{19}$ cm$^{-3}$. However, the p-type dopant concentration of a part of the p-type nitride semiconductor layer 16 located on the side of the MQW light emitting layer 14 may be less than $1 \times 10^{19}$ cm$^{-3}$.

Although the total thickness of the p-type nitride semiconductor layers 16, 17 and 18 is not particularly limited, it is preferably equal to or more than 50 nm but equal to or less than 300 nm. The thickness of the p-type nitride semiconductor layers 16, 17 and 18 is decreased, and thus it is possible to reduce the time period during which heating is performed at the time of growth. In this way, it is possible to reduce the diffusion of the p-type dopant to the MQW light emitting layer 14.

The n-side electrode 21 and the p-side electrode 25 are electrodes for feeding the drive power to the nitride semiconductor light emitting element 1. Although in FIG. 2, the n-side electrode 21 and the p-side electrode 25 are formed with only pad electrode parts, an elongated protrusion portion (branch electrode) for current diffusion may be connected to either of the n-side electrode 21 and the p-side electrode 25. Below the p-side electrode 25, an insulating layer for preventing current from being injected into the p-side electrode 25 is preferably provided. In this way, the amount of emitted light that is blocked by the p-side electrode 25 is reduced.

The n-side electrode 21 is preferably formed by depositing, for example, a titanium layer, an aluminum layer and a gold layer in this order. With the assumption that wire bonding is performed on the n-side electrode 21, the thickness of the n-side electrode 21 is preferably equal to or more than 1 μm.

The p-side electrode 25 is preferably formed by depositing, for example, a nickel layer, an aluminum layer, a titanium layer and a gold layer in this order, and may be formed of the same material as that of the n-side electrode 21. With the assumption that wire bonding is performed on the p-side electrode 25, the thickness of the p-side electrode 25 is preferably equal to or more than 1 μm.

The transparent electrode 23 is preferably formed with a transparent conductive film such as ITO (indium tin oxide) or IZO (indium zinc oxide), and preferably has a thickness equal to or more than 20 nm but equal to or less than 200 nm.

It is thought that in the nitride semiconductor light emitting element 1, most of the starting points of the V pits 15 are not present with the MQW light emitting layer 14, and a large majority of them are present within the intermediate layer (superlattice layer) 122. It is thought that since the V pits 15 are produced due to threading dislocations, a large number of threading dislocations are present within the V pits 15. In this way, it is possible to reduce the entrance of electrons and holes injected into the MQW light emitting layer 14 into the V pits 15. Hence, it is estimated that the occurrence of non-light emission recombination caused by capturing of electrons and holes by threading dislocations is reduced. Consequently, it is possible to reduce the decrease in luminous efficiency. This is remarkable at the time of drive at a high temperature or at the time of drive with a high current.

Specifically, since the movement of carriers (holes or electrons) injected into the MQW light emitting layer 14 is activated at a high temperature, the probability that the injected carries reach the threading dislocations is increased. However, in the nitride semiconductor light emitting element 1, since a large number of threading dislocations within the MQW light emitting layer 14 are covered by the V pits 15 (since a large number of threading dislocations are present within the V pits 15), non-light emission recombination in threading dislocations is reduced. Thus, it is possible to reduce the decrease in luminous efficiency at a high temperature.

Since the starting points of the V pits 15 are located in the lower side of the MQW light emitting layer 14, the number of undoped barrier layers is increased, and thus it is possible to increase the volume of the MQW light emitting layer 14, which contributes to light emission. Thus, it is possible to reduce the decrease in luminous efficiency at the time of drive with a high current.

The carrier concentration means the concentration of electrons or holes, and is not determined only by the amount of n-type dopant or the amount of p-type dopant. The carrier concentration described above is calculated based on the result of voltage versus capacity characteristics of the nitride semiconductor light emitting element 1, indicates the carrier concentration in a state where current is not injected and is the total of carriers that are generated from ionized impurities, crystal defects which are transformed into donors and crystal defects which are transformed into accepters.

However, since the activation rate of Si or the like which is an n-type dopant is high, the n-type carrier concentration can be considered to be substantially equal to the n-type dopant concentration. The n-type dopant concentration can be easily determined by measuring the concentration distribution in the direction of the depth through SIMS (secondary ion mass spectroscopy). Furthermore, the relative relationship (ratio) of the dopant concentration is substantially the same as the relative relationship (ratio) of the carrier concentration. Thus, as the means for solving the problem, the definition is made using the dopant concentration, which is easily measured. The n-type dopant concentrations obtained by the measurement are averaged in the direction of the thickness, and thus it is possible to obtain the averaged n-type dopant concentration.

In the nitride semiconductor light emitting element 1, as described above, between the lower n-type nitride semiconductor layer 8 and the MQW light emitting layer 14, from the side of the lower n-type nitride semiconductor layer 8, the structure where the n-type nitride semiconductor modulation doped layer 9, the low-temperature n-type nitride semiconductor layer (V pit generation layer) 10, the multilayer structure member 121 and the intermediate layer (superlattice layer) 122 are deposited in this order is inserted.

In this way, even when a high voltage in the reverse bias direction that causes ESD destroy is applied between the n-side electrode 21 and the p-side electrode 25, the depletion layer is extended to the side of the n-type nitride semiconductor modulation doped layer 9 and the intermediate layer (superlattice layer) 122. Thus, it is possible to reduce the reverse bias voltage (electric field) applied to the MQW light emitting layer 14.

Hence, even when a high voltage in the reverse bias direction is applied between the n-side electrode 21 and the p-side electrode 25, the electric field applied to the MQW light emitting layer 14 is relaxed. Consequently, it is possible to increase the threshold voltage which causes ESD destroy, that is, ESD voltage resistance.

Even when the V pits 15 are not intentionally introduced, it is possible to reduce the increase in leak current when a forward bias voltage is applied and the decrease in light emission area caused by the V pits 15. In this way, it is possible to effectively reduce the decrease in light emission characteristics caused by the above problems.

Although the above actions and effects when both the n-type nitride semiconductor modulation doped layer 9 and the intermediate layer (superlattice layer) 122 are used are described, only either of the n-type nitride semiconductor modulation doped layer 9 and the intermediate layer (superlattice layer) 122 may be used. However, when both the n-type nitride semiconductor modulation doped layer 9 and the intermediate layer (superlattice layer) 122 are used, it is possible to more increase the ESD voltage resistance, and to more effectively reduce the increase in leak current when a forward bias voltage is applied and the decrease in light emission area caused by the V pits 15.

A method of manufacturing the nitride semiconductor light emitting element 1 will then be described.

The buffer layer 5 is first formed on the substrate 3 by, for example, a sputtering method. Then, by, for example, a MOCVD method, on the buffer layer 5, the first nitride semiconductor foundation layer 7a, the second nitride semiconductor foundation layer 7b that is provided so as to be in contact with the surfaces of the buffer layer 5 and the first nitride semiconductor foundation layer 7a, the lower n-type nitride semiconductor layer 8, the n-type nitride semiconductor modulation doped layer 9, the low-temperature n-type nitride semiconductor layer (V pit generation layer) 10, the multilayer structure member 121, the intermediate layer (superlattice layer) 122, the MQW light emitting layer 14, the p-type nitride semiconductor layer 16, the p-type nitride semiconductor layer 17 and the p-type nitride semiconductor layer 18 are formed in this order.

Then, in order for part of the lower n-type nitride semiconductor layer 8 to be exposed, part of the p-type nitride semiconductor layer 18, the p-type nitride semiconductor layer 17, the p-type nitride semiconductor layer 16, the MQW light emitting layer 14, the intermediate layer (superlattice layer) 122, the multilayer structure member 121, the low-temperature n-type nitride semiconductor layer (V pit generation layer) 10, the n-type nitride semiconductor modulation doped layer 9 and the lower n-type nitride semiconductor layer 8 is etched. On the upper surface of the lower n-type nitride semiconductor layer 8 exposed by this etching, the n-side electrode 21 is formed.

On the upper surface of the p-type nitride semiconductor layer 18, the transparent electrode 23 and the p-side electrode 25 are sequentially deposited. Thereafter, the transparent protective film 27 is formed so as to cover the transparent electrode 23 and the side surfaces of the layers exposed by the above etching. Thus, it is possible to obtain the nitride semiconductor light emitting element shown in FIG. 1. The composition, the thickness and the like of each layer are as described above.

Although a method of forming the low-temperature n-type nitride semiconductor layer (V pit generation layer) 10 is not particularly limited, the low-temperature n-type nitride semiconductor layer (V pit generation layer) 10 is preferably grown at a temperature (second growth temperature) lower than the growth temperature (first growth temperature) of the n-type nitride semiconductor modulation doped layer 9 and the lower n-type nitride semiconductor layer 8. Specifically, (the first growth temperature—the second growth temperature) is preferably set equal to or more than 50° C., and is more preferably set equal to or more than 100° C. In other words, the growth temperature of the low-temperature n-type nitride semiconductor layer (V pit generation layer) 10 is preferably set equal to or less than 920° C., is more preferably set equal to or less than 860° C. and is further preferably set equal to or less than 820° C. The growth temperature of the low-temperature n-type nitride semiconductor layer (V pit generation layer) 10 is preferably set equal to or more than 600° C., and is more preferably set equal to or more than 700° C. In this way, since the film quality of the low-temperature n-type nitride semiconductor layer (V pit generation layer) 10 is degraded as compared with the film quality of the n-type nitride semiconductor modulation doped layer 9, the effect of forming the V pits by the low-temperature n-type nitride semiconductor layer (V pit generation layer) 10 is enhanced. In this way, the V pits 15 are formed in the MQW light emitting layer 14.

When the growth temperature of the low-temperature n-type nitride semiconductor layer (V pit generation layer) 10 is excessively low, the luminous efficiency of the MQW light emitting layer 14 may be lowered. Hence, (the first growth temperature—the second growth temperature) is preferably set equal to or less than 400° C., and is further preferably set equal to or less than 300° C.

The low-temperature n-type nitride semiconductor layer (V pit generation layer) 10 may be formed by increasing the n-type dopant concentration as compared with that of the n-type nitride semiconductor modulation doped layer 9. Even in this case, the effect of forming the V pits by the low-temperature n-type nitride semiconductor layer (V pit generation layer) 10 is enhanced. In this way, the V pits 15 are formed in the MQW light emitting layer 14. The n-type dopant concentration is as described above in [Low-temperature nitride semiconductor layer (V pit generation layer)].

Although a method of forming the multilayer structure member 121 is not particularly limited, the multilayer structure member 121 is preferably grown at a temperature (third growth temperature) equal to or less than the growth temperature (second growth temperature) of the low-temperature n-type nitride semiconductor layer (V pit generation layer) 10. In this way, since it is possible to obtain the effect of increasing the size of the V pits 15 generated in the low-temperature n-type nitride semiconductor layer (V pit generation layer) 10, it is possible to reduce the failure rate caused by ESD. In order for this effect to be effectively obtained, the third growth temperature is preferably set equal to or more than 600° C., and is more preferably set equal to or more than 600° C. but equal to or less than 900° C.

Although a method of forming the intermediate layer (superlattice layer) 122 is not particularly limited, the intermediate layer (superlattice layer) 122 is preferably grown at a temperature (fourth growth temperature) equal to or less than the growth temperature (third growth temperature) of the multilayer structure member 121. In this way, it is possible to obtain the effect of increasing the size of the V pits 15 generated in the low-temperature n-type nitride semiconductor layer (V pit generation layer) 10. In order for this effect to be effectively obtained, the fourth growth temperature is preferably set equal to or more than 600° C. but equal to or less than 900° C., and is more preferably set equal to or more than 600° C. but equal to or less than 800° C.

The growth temperature (second growth temperature) of the low-temperature n-type nitride semiconductor layer (V pit generation layer) 10, the growth temperature (third growth temperature) of the multilayer structure member 121 and the growth temperature (fourth growth temperature) of the intermediate layer (superlattice layer) 122 are preferably equal to each other. In this way, it is possible to obtain the effect of increasing the size of the V pits 15 generated in the low-temperature n-type nitride semiconductor layer (V pit generation layer) 10. In order for this effect to be effectively obtained, the growth temperature (second growth temperature) of the low-temperature n-type nitride semiconductor layer (V pit generation layer) 10, the growth temperature (third growth temperature) of the multilayer structure member 121 and the growth temperature (fourth growth temperature) of the intermediate layer (superlattice layer) 122 are preferably set equal to or more than 600° C. but equal to or less than 900° C., and is more preferably set equal to or more than 600° C. but equal to or less than 850° C.

Example 1 of the present embodiment will then be described specifically. The present embodiment is not limited to Examples that will be described below.

A process of manufacturing the nitride semiconductor light emitting element 1 of Example 1 is as described below.

First, a wafer of a sapphire substrate 3 whose upper surface was subjected to concave and convex processing of convex portions 3A and concave portions 3B and which had a diameter of 100 mm was prepared. The convex portion 3A was substantially circular in plan view, and three adjacent convex portions 3A were arranged so as to be located on the apexes of a substantially regular triangle in plan view. The distance between the adjacent three convex portions 3A was 2 μm.

The concave and convex processing method of the substrate 3 will be described in detail. On the substrate 3, a mask that defined the planar arrangement of the convex portions 3A shown in FIG. 4 was formed. Then, this mask was used to dry-etch the surface of the substrate 3, and thus the concave portions 3B were formed in the planar arrangement shown in FIG. 4.

Thus, the convex portions 3A on the surface of the substrate 3 were aligned in an a(sub) axial direction of the surface of the substrate 3 (<11-20> direction), and are aligned in a direction inclined +60° with respect to the a(sub) axial direction of the surface of the substrate 3 and are aligned in a direction inclined −60° with respect to the a(sub) axial direction of the surface of the substrate 3 (each of the directions is a u direction). Here, in plan view on the surface of the substrate 3, the convex portions 3A were arranged on the apexes of an imaginary triangle $3t$ indicated by broken lines in FIG. 4, and were periodically aligned in the directions of the three sides of the imaginary triangle $3t$.

The planar shape of the bottom surface of the convex portion 3A was circular. In plan view on the surface of the substrate 3, the distance between the adjacent convex portions 3A was 2 μm, the diameter of the circle that is the planar shape of the bottom surface of the convex portion 3A was about 1.2 μm and the height of the convex portion 3A was about 0.6 μm. Furthermore, each of the convex portion 3A and the concave portion 3B on the surface of the substrate 3 had the cross section shown in FIG. 1, and the convex portion had a top end portion.

RCA cleaning was performed on the surface of the substrate 3 after the formation of the convex portions 3A and the concave portions 3B. Then, the substrate 3 after the RCA cleaning was set in a chamber, $N_2$, $O_2$ and Ar were introduced and the substrate was heated to 650° C. By a reactive sputtering method in which an Al target was sputtered in an atmosphere of the mixture of $N_2$, $O_2$ and Ar, on the surface of the substrate 3 having the convex portions 3A and the concave portions 3B, a buffer layer 5 having a thickness of 25 nm was formed that was formed of an AlON crystal of an aggregation of columnar crystals having uniform crystal grains extending in a normal direction to the surface of the substrate 3.

The wafer (substrate 3) on which the buffer layer 5 was formed was held within a first MOCVD device. By a MOCVD method, the first nitride semiconductor foundation layer $7a$ and the second nitride semiconductor foundation layer $7b$ formed of undoped GaN were grown on the upper surface of the buffer layer 5, and then the lower n-type nitride semiconductor layer $8a$ formed of Si-doped n-type GaN was grown on the upper surface $7b1$ of the second nitride semiconductor foundation layer $7b$. Here, the thickness of the entire foundation layer 7 was set at 4 μm, the thickness of the lower n-type nitride semiconductor layer $8a$ was set at 3 μm and the n-type dopant concentration of the lower n-type nitride semiconductor layer $8a$ was set at $1 \times 10^{19}$ cm$^{-3}$.

The wafer (substrate 3) taken out of the first MOCVD device was held within a second MOCVD device. The wafer temperature was set at 1081° C. (first growth temperature), and the lower n-type nitride semiconductor layer $8b$ was grown on the upper surface of the lower n-type nitride semiconductor layer $8a$. The lower n-type nitride semiconductor layer $8b$ was an n-type GaN layer whose n-type dopant concentration was $1 \times 10^{19}$ cm$^{-3}$, and its thickness was 1.5 μm.

In a state where the wafer temperature was maintained at 1081° C. (first growth temperature), on the lower n-type nitride semiconductor layer $8b$, an n-type nitride semiconductor layer formed of Si-doped n-type GaN having a thickness of 50 nm (the n-type GaN layer 9A, the n-type dopant concentration: $1 \times 10^{19}$ cm$^{-3}$), a nitride semiconductor layer formed of undoped GaN having a thickness of 87 nm (the GaN layer 9B), an n-type nitride semiconductor layer formed of Si-doped n-type GaN having a thickness of 50 nm (the n-type GaN layer 9A, the n-type dopant concentration: $1 \times 10^{19}$ cm$^{-3}$) and a nitride semiconductor layer formed of undoped GaN having a thickness of 87 nm (the GaN layer 9B) were crystal-grown in this order by a MOCVD method, with the result that the n-type nitride semiconductor modulation doped layer 9 was deposited.

Then, the wafer temperature was set at 801° C. (second growth temperature), and the low-temperature n-type nitride semiconductor layer (V pit generation layer) 10 was grown on the upper surface of the n-type nitride semiconductor modulation doped layer 9. Specifically, a Si-doped GaN layer having a thickness of 25 nm was grown such that the n-type dopant concentration was $1 \times 10^{19}$ cm$^{-3}$.

In a state where the wafer temperature was maintained at 801° C. (third growth temperature), the multilayer structure member 121 was grown. Specifically, a Si-doped InGaN layer having a thickness of 7 nm, a Si-doped GaN layer having a thickness of 30 nm, a Si-doped InGaN layer having a thickness of 7 nm and a Si-doped GaN layer having a thickness of 20 nm were alternately deposited two by two, with the result that the multilayer structure member 121 was formed. The n-type dopant concentration of each of the layers of the multilayer structure member 121 was set at $7 \times 10^{17}$ cm$^{-3}$. The In composition ratio in the InGaN layer was set such that it was the same as the In composition ratio of the narrow band gap layer 122B of the intermediate layer (superlattice layer) 122 to be grown substantially.

Then, in a state where the wafer temperature was maintained at 801° C. (fourth growth temperature), the intermediate layer (superlattice layer) 122 was grown. Specifically, a wide band gap layer 122A formed of Si-doped GaN and a narrow band gap layer 122B formed of Si-doped InGaN were alternately grown periodically twenty times. The thickness of each wide band gap layer 122A was 1.55 nm. The thickness of each narrow band gap layer 122B was 1.55 nm.

With respect to the n-type dopant concentration of each wide band gap layer 122A, the n-type dopant concentration of the five wide band gap layers 122A located on the side of the MQW light emitting layer 14 was $1 \times 10^{19}$ cm$^{-3}$, and the n-type dopant concentration of the wide band gap layer 122A located on the side of the substrate 3 as compared with the five wide band gap layers 122A was 0 cm$^{-3}$ (undoped).

With respect to the n-type dopant concentration of each narrow band gap layer 122B, the n-type dopant concentration of the five narrow band gap layers 122B located on the side of the MQW light emitting layer 14 was $1 \times 10^{19}$ cm$^{-3}$, and the n-type dopant concentration of the narrow band gap layer 122B located on the side of the substrate 3 as compared with the five narrow band gap layers 122B was 0 cm$^{-3}$ (undoped). Since the amount of flow of TMI (trimethylindium) was adjusted such that the wavelength of light emitted from the well layer 14W by photoluminescence was 375 nm, the composition of each narrow band gap layer 122B was $In_yGa_{1-y}N$ (y=0.04).

Then, the wafer temperature was decreased to 672° C., and the MQW light emitting layer 14 was grown. Specifically, the barrier layer 14A and the well layer 14W formed of InGaN were alternately grown, and eight well layers 14W were grown. The thickness of each barrier layer 14A was 4.2 nm. The n-type dopant concentration of the first barrier layer 14Az and the barrier layer 14A7 was $4.3 \times 10^{18}$ cm$^{-3}$, and the n-type dopant concentration of the other barrier layers 14A6, 14A5, . . . and 14A1 were undoped.

The thickness of the first barrier layer 14Az may be greater than that of the barrier layer 14A7 (for example, a thickness of 5.05 nm) so that among the intermediate layers (superlattice layers) 122, the narrow band gap layer 122B located closest to the side of the MQW light emitting layer 14 was formed and so that the action of the wide band gap layer 122A which was not included in the number of pairs of the intermediate layers (superlattice layers) 122 was achieved. With respect to the n-type dopant concentration of the first barrier layer 14Az, the n-type dopant concentration of the upper portion of the first barrier layer 14Az (region 1.55 nm away from the upper surface of the first barrier layer 14Az) may be set at $1\times10^{19}$ cm$^{-3}$, and the n-type dopant concentration of the lower portion of the first barrier layer 14Az (portion other than the upper surface of the first barrier layer 14Az) may be set at $4.3\times10^{18}$ cm$^{-3}$.

Only the lower portion of the barrier layer 14A7 (region 3.5 nm away from the lower surface of the barrier layer 14A7) may be doped with the n-type dopant, and the upper portion of the barrier layer 14A7 (portion other than the lower portion of the barrier layer 14A) may be undoped. As described above, the upper portion of the barrier layer 14A7 is undoped, and thus it is possible to prevent carriers injected into the well layer 14W7 from being in direct contact with the n-type doped barrier layer portion.

For the well layer 14W, as the carrier gas, nitrogen gas was used, and an undoped $In_xGa_{1-x}N$ layer (x=0.20) was grown. The thickness of each well layer 14W was set at 2.7 nm. The amount of flow of TMI was adjusted such that the wavelength of light emitted from the well layer 14W by photoluminescence was 448 nm, and thus the In composition x of the well layer 14W was set.

Then, on the well layer 14W1, which was the uppermost layer, the last barrier layer 14A0 (thickness of 10 nm) formed with an undoped GaN layer was grown.

The wafer temperature was increased to 1000° C., and on the upper surface of the last barrier layer 14A0, as the p-type nitride semiconductor layers 16, 17 and 18, a p-type $Al_{0.18}Ga_{0.82}N$ layer, a p-type GaN layer and a p-type contact layer were respectively grown.

In the MOCVD growth of the individual layers described above, as the raw gas of Ga, TMG (trimethyl gallium) was used, as the raw gas of Al, TMA (trimethyl aluminum) was used, as the raw gas of In, TMI (trimethyl indium) was used and as the raw gas of N, NH$_3$ was used. As the raw gas of Si, which was the n-type dopant, SiH$_4$ was used, and as the raw gas of Mg, which was the p-type dopant, Cp$_2$Mg was used. However, the raw gas is not limited to the gases described above, and any gas that is used as a MOCVD raw gas can be used without any limitation. Specifically, as the raw gas of Ga, TEG (triethyl gallium) can be used, as the raw gas of Al, TEA triethyl aluminum) was used, as the raw gas of In, TEI (triethyl indium) was used, the raw gas of N, an organic nitrogen compound such as DMHy (dimethylhydrazine) can be used and as the raw gas of Si, Si$_2$H$_6$ or organic Si can be used.

Then, in order for part of the lower n-type nitride semiconductor layer 8 to be exposed, parts of the p-type contact layer (the p-type nitride semiconductor layer 18), the p-type GaN layer (the p-type nitride semiconductor layer 17), the p-type AlGaN layer (the p-type nitride semiconductor layer 16), the MQW light emitting layer 14, the intermediate layer (superlattice layer) 122, the multilayer structure member 121, the low-temperature n-type nitride semiconductor layer (V pit generation layer) 10 and the n-type nitride semiconductor modulation doped layer 9 were etched. On the upper surface of the lower n-type nitride semiconductor layer 8 exposed by this etching, the n-side electrode 21 made of Au was formed. On the upper surface of the p-type contact layer 18, the transparent electrode 23 made of ITO and the p-side electrode 25 made of Au were sequentially formed. The transparent protective film 27 made of SiO$_2$ was formed so as to mainly cover the side surfaces of the transparent electrode 23 and the layers exposed by the above etching.

Then, the wafer was divided into chips having a size of 620×680 μm. In this way, it was possible to obtain the nitride semiconductor light emitting element 1 according to Example 1.

The nitride semiconductor light emitting element 1 obtained by the manufacturing method described above was mounted on a TO-18 type stem, the light output of the nitride semiconductor light emitting element 1 was measured without resin sealing being performed. When the nitride semiconductor light emitting element 1 was driven in the environment of 25° C. with a current of 85 mA, it was able to obtain a light output P (25)=101.5 mW (dominant wavelength of 449 nm) at a drive voltage of 3.20 V. When the nitride semiconductor light emitting element was driven in the environment of 80° C. with a current of 85 mA, it was able to obtain a light output P (80)=98.9 mW. In this way, the temperature characteristics according to the light output P were P (80)/P (25)=97.4%. In this description, the light output P in the environment of 25° C. was represented by P (25), and the light output P in the environment of 80° C. was represented by P (80).

Furthermore, in order for effects at the time of drive with a high current of 120 mA to be checked, the growth device and the growth conditions of the foundation layer 7 were changed, and several nitride semiconductor light emitting elements 1 (chip size: 620×680 μm) were produced. Then, in the same manner as described above, light outputs P (25) and P (80) were measured, and the temperature characteristics: P (80)/P (25) were determined.

Figure 5:
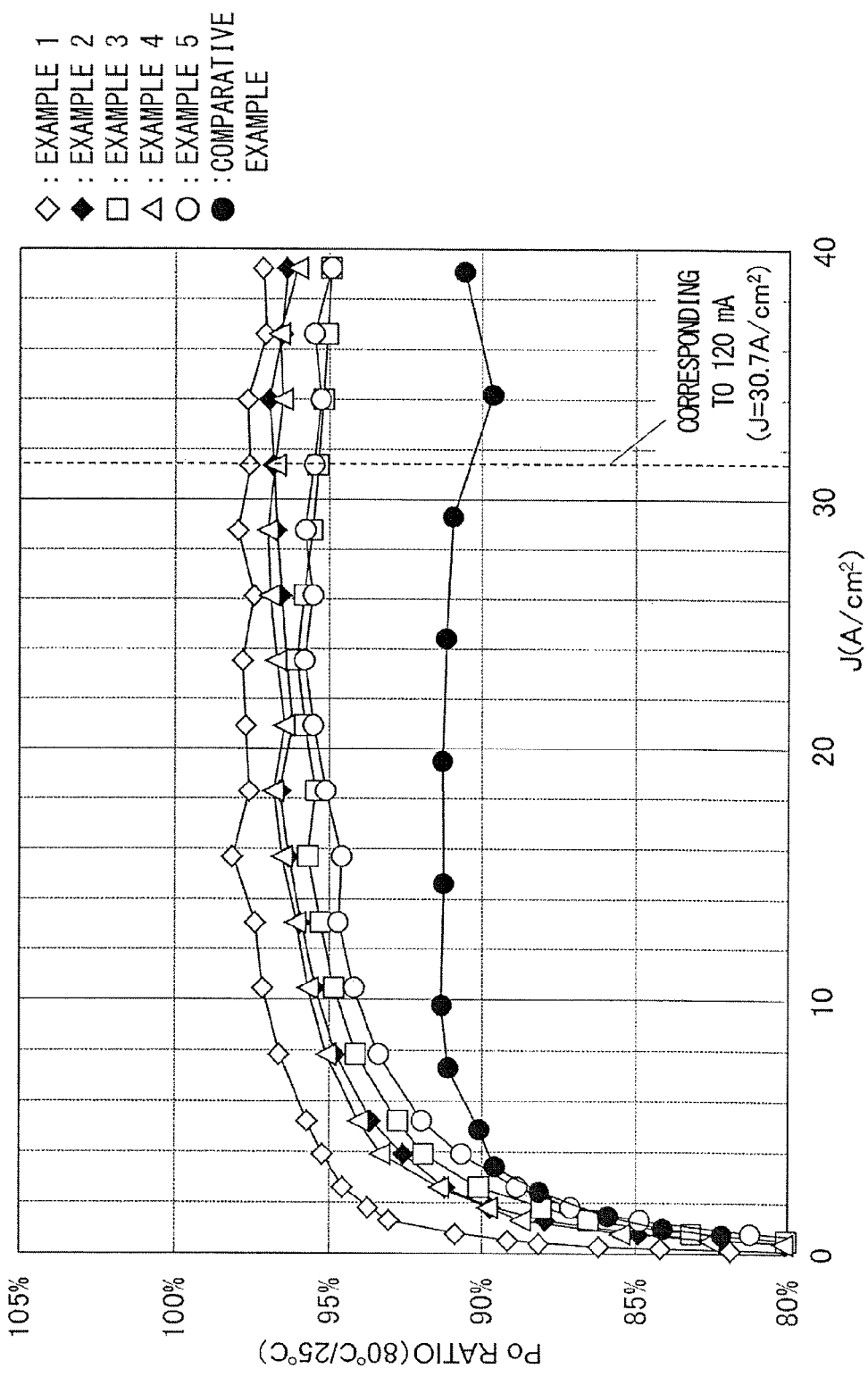
FIG. 5 A graph showing a relationship between a current density and light output temperature characteristics in the nitride semiconductor light emitting element according to the embodiment of the present invention.

As a comparative example, instead of the AlON buffer layer, a low-temperature growth GaN layer by a MOCVD method was used, a nitride semiconductor light emitting element having the same structure except what has been described above was produced and in the same manner as described above, the temperature characteristics: P (80)/P (25) were determined and compared. In Examples and the comparative example, with the assumption that the (004) plane of GaN crystal and the (102) plane of GaN crystal were reflective planes, the X ray rocking curve half-value widths: ω (004), ω (102) were measured. However, (004) and (102) indicate crystal directions. Variations in the temperature characteristics: P (80)/P (25) with the current density: J (A/cm$^2$) in Examples 1 to 5 are shown in FIG. 5, and a relationship between the X ray rocking curve half-value widths: ω (004), ω (102) and the dislocation densities corresponding to ω (004), ω (102) and the temperature characteristics: P (80)/P (25) at the time of drive with a current of 120 mA in FIG. 5 is shown in table 1. In the nitride semiconductor light emitting element 1 of the present embodiment, spiral dislocations were dominant in ω (004), and edge dislocations were dominant in ω (102).

TABLE 1

|  | X HALF-VALUE WIDTH | | DISLOCATION DENSITY | | TEMPERATURE CHARACTERISTICS |
| --- | --- | --- | --- | --- | --- |
|  | ω (004) [arcsec] | ω (102) [arcsec] | ω (004) [/cm$^2$] | ω (102) [/cm$^2$] | P(80)/P(25) [%] |
| EXAMPLE 1 | 27.0 | 95.0 | 1.5E+06 | 6.7E+06 | 98.0 |
| EXAMPLE 2 | 34.2 | 117.8 | 2.4E+06 | 1.1E+07 | 96.7 |
| EXAMPLE 3 | 37.6 | 120.0 | 2.8E+06 | 1.3E+07 | 95.6 |
| EXAMPLE 4 | 33.9 | 116.2 | 2.3E+06 | 1.1E+07 | 97.0 |
| EXAMPLE 5 | 33.2 | 122.6 | 2.2E+06 | 1.0E+07 | 95.8 |
| COMPARATIVE EXAMPLE 1 | 197.7 | 264.0 | 7.9E+07 | 3.6E+08 | 90.7 |

As is clear from table 1, it has been found in the present embodiment that as the X ray rocking curve half-value widths: ω (004), ω (102) were decreased, the temperature characteristics: P (80)/P (25) were brought closer to 100%. It has been found that with respect to the X ray rocking curve half-value widths ω (004), ω (102) and the dislocation densities corresponding to ω (004), ω (102), when it is assumed that ω is $X_{(004)}$, and ω is $X_{(102)}$, and that the dislocation densities are $Y_{(004)}$ and $Y_{(102)}$, there were a correlation of $Y_{(004)}=2009.5X_{(004)}^2$ and a correlation of $Y_{(102)}=9261.7X_{(102)}^2-1671.6X_{(102)}$.

As described above, the configurations of the layers and the parameter conditions in the process of manufacturing the nitride semiconductor light emitting element 1 were specified, and the X ray rocking curve half-value width w was controlled, with the result that it was able to obtain the nitride semiconductor light emitting element 1 which had satisfactory temperature characteristics even at the time of drive with a high current.

For example, at the time of drive with a high current of 120 mA, ω (004) is set at 40 arc sec or less or ω (102) is set at 130 arc sec or less. Here, dislocation densities corresponding to ω (004), ω (102) are respectively 3.2×10$^6$ or less and 1.6×10$^8$ or less per unit square centimeter. More preferably, ω (004) is set at 35 arc sec or less or ω (102) is set at 110 arc sec or less. Here, dislocation densities corresponding to ω (004), ω (102) are respectively 2.5×10$^6$ or less and 1.1×10$^8$ or less per unit square centimeter. As described above, the value of ω(or the value of the dislocation density) is specified, and thus it is possible to obtain the nitride semiconductor light emitting element 1 having excellent temperature characteristics in which P (80)/P (25) is 95% or more. The X ray rocking curve half-value widths: ω (004), ω (102) are not zero even if they are measured in the ideal state; for example, that ω (004) is 40 arc sec or less means "0<ω (004)≤40[arc see]", and that ω (102) is 130 arc sec or less means "0<ω (102)≤130[arc see]".

Figure 6:
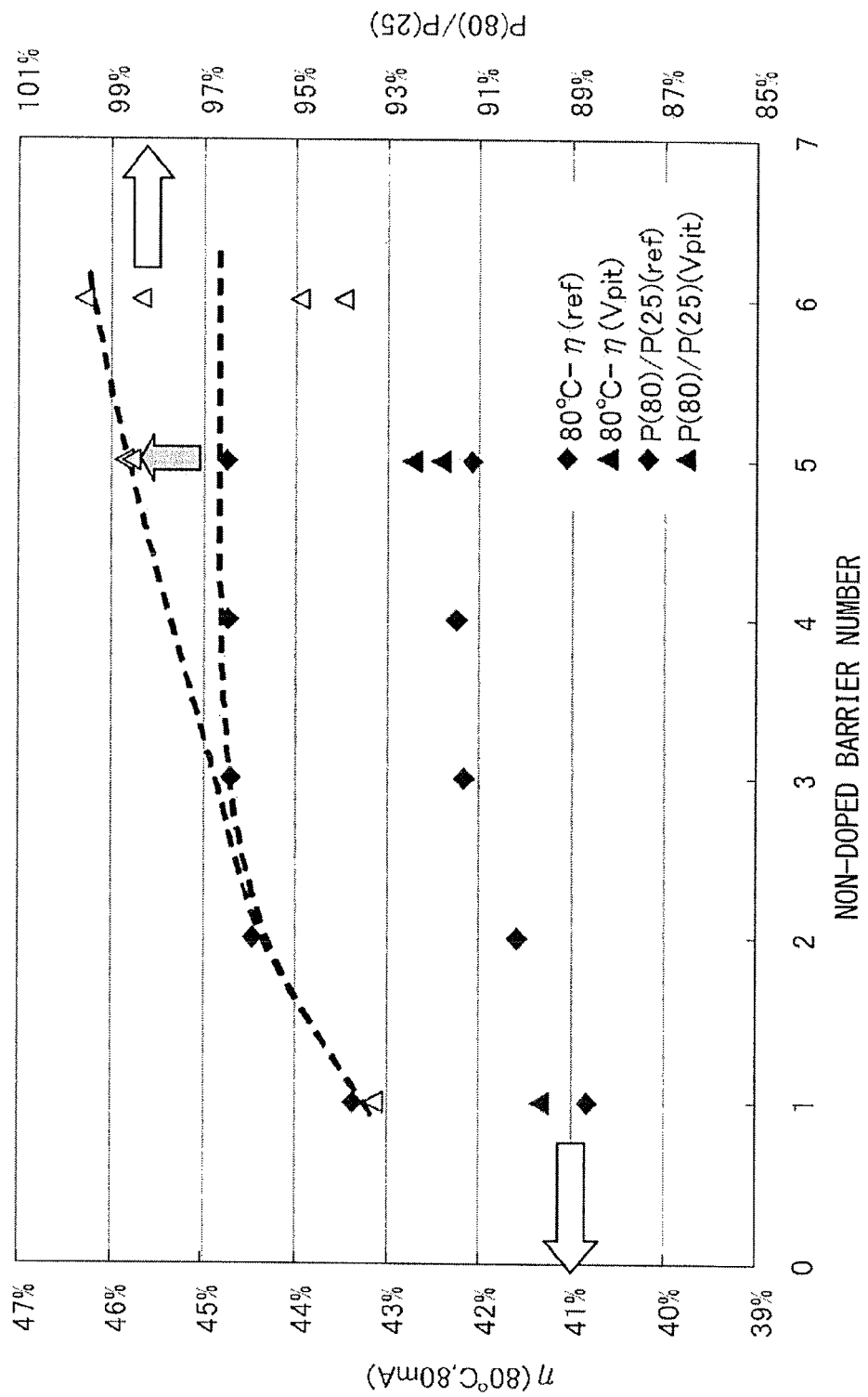
FIG. 6 A graph showing a relationship between the number of barrier layers in an MQW light emitting layer and luminous efficiency η in the nitride semiconductor light emitting element according to the embodiment of the present invention.

With the X ray rocking curve half-value width ω within the above range, the number of barrier layers (Si undoped barrier layers) in the MQW light emitting layer 14 was changed and the relationship between the number of barrier layers in the MQW light emitting layer 14 and the temperature characteristics of the nitride semiconductor light emitting element was checked. The results thereof are shown in FIG. 6. In FIG. 6, the horizontal axis represents the number of barrier layers in the MQW light emitting layer 14, the vertical axis on the left represents the luminous efficiency η in the environment of 80° C. with a drive current of 80 mA and the vertical axis on the right represents a ratio (P (80)/P (25)) between the light output P (25) at 25° C. and the light output P (80). With respect to the X ray rocking curve half-value width ω here, in either case, ω (004) was within a range of 25.2 to 26.5 arc sec, and ω (102) was within a range of 94.9 to 97.8 arc sec. In FIG. 6, "(Vpit)" means that the low-temperature n-type nitride semiconductor layer (V pit generation layer) 10 is provided, and "(ref)" means that the low-temperature n-type nitride semiconductor layer (V pit generation layer) 10 is not provided.

As shown in FIG. 6, it has been found that in a structure where the low-temperature n-type nitride semiconductor layer (V pit generation layer) 10 is provided, as compared with a structure where the low-temperature n-type nitride semiconductor layer (V pit generation layer) 10 is not provided, when the number of barrier layers (Si undoped barrier layers) in the MQW light emitting layer 114 is equal to or more than 4 but equal to or less than 6, the temperature characteristics: P (80)/P (25) are particularly enhanced. An expected temperature line (broken line in the upper side of FIG. 6) is inserted, and thus even when the number of barrier layers (Si undoped barrier layers) in the MQW light emitting layer 14 is equal to or more than 7 but equal to or less than 9, it is estimated that satisfactory temperature characteristics can be obtained.

Consequently, when in the structure where the low-temperature n-type nitride semiconductor layer (V pit generation layer) 10 is provided, ω (004) is set at 40 arc sec or less or ω (102) is set at 130 arc sec or less, and more preferably ω (004) is set at 35 arc sec or less or ω (102) is set at 110 arc sec or less, the number of undoped barrier layers (or lightly doped barrier layers that are slightly doped) is set at 2 or more, and preferably 4 or more, with the result that it is possible to obtain the nitride semiconductor light emitting element 1 having temperature characteristics in which P (80)/P (25) is 95% or more. The "lightly doped" described above means a case where the dopant concentration is 2×10$^{17}$ cm$^{-3}$.

Normally, when the nitride semiconductor light emitting element is driven with a high current, the temperature of the nitride semiconductor light emitting element is proportionally increased. When a conventional nitride semiconductor light emitting element is driven with a high current, and its current density exceeds 10 A/cm$^2$, as is understood from FIG. 5, the temperature characteristics: P (80)/P (25) tend to reach at most around 90% or the characteristics tend to be degraded as the current density is increased even if the initial characteristic is good.

On the other hand, in the present embodiment, unlike the conventional nitride semiconductor light emitting element such as one where light is emitted in a low-current drive region of about 20 mA or one where light is emitted with a current density of about 10 A/cm$^2$, even when the nitride semiconductor light emitting element is driven with a current density of 20 A/cm$^2$ or more, and preferably 30 A/cm$^2$ or more, it is possible to obtain the nitride semiconductor light emitting element 1 having temperature characteristics in which P (80)/P (25) is 95% or more.

In other words, for example, even when the nitride semiconductor light emitting element 1 having a chip size of 620×680 μm is driven in a high-current region of 120 mA or more (current density ≈30.7 A/cm$^2$), the light output of the nitride semiconductor light emitting element 1 is high, which is one point of the invention.

Although the embodiment and Examples of the present invention have been described above, the scope of the present invention is not limited to those, and various modifications are possible without departing from the spirit of the invention.

The present invention can be utilized for a nitride semiconductor light emitting element and a method of manufacturing such a nitride semiconductor light emitting element.

LIST OF REFERENCE SYMBOLS 1 nitride semiconductor light emitting element
3 substrate
3a convex portion
3b concave portion
5 buffer layer
7 foundation layer
7a first nitride semiconductor foundation layer
7b second nitride semiconductor foundation layer
8a, 8b lower n-type nitride semiconductor layer
9 n-type nitride semiconductor modulation doped layer
10 low-temperature n-type nitride semiconductor layer (V pit generation layer)
14 MQW light emitting layer (light emitting layer)
14A barrier layer
14W well layer
15 V pit
16, 17, 18 p-type nitride semiconductor layer
21 n-side electrode
23 transparent electrode
25 p-side electrode
27 transparent protective film
30 mesa portion
121 multilayer structure member
122 superlattice layer, that is, intermediate layer
122A wide band gap layer
122B narrow band gap layer

The invention claimed is:

1. A nitride semiconductor light emitting element comprising:
a substrate;
a buffer layer that is provided on the substrate;
a foundation layer that is provided on the buffer layer;
an n-type nitride semiconductor layer that is provided on the foundation layer;
a light emitting layer that is provided on the n-type nitride semiconductor layer; and
a p-type nitride semiconductor layer that is provided on the light emitting layer,
wherein an X ray rocking curve half-value width ω (004) of a (004) plane that is a crystal plane of each of the layers of the nitride semiconductor light emitting element is 40 arc sec or less or an X ray rocking curve half-value width ω (102) of a (102) plane is 130 arc sec or less, and
a ratio P (80)/P (25) between a light output P (25) at 25° C. and a light output P (80) at 80° C. with a same operating current is 95% or more.

2. The nitride semiconductor light emitting element according to claim 1,
wherein the nitride semiconductor light emitting element is driven in a high-current region where a current density is 20 A/cm$^2$ or more.

3. The nitride semiconductor light emitting element according to claim 1,
wherein the buffer layer is formed of AlN or AlON.

4. The nitride semiconductor light emitting element according to claim 1,
wherein the substrate includes a plurality of concave portions and a plurality of convex portions arranged between the adjacent concave portions in a surface on which the buffer layer is provided, and
the foundation layer provided on the buffer layer includes: a first foundation layer that is formed on the concave portions of the substrate and that includes a diagonal facet plane; and a second foundation layer that is formed so as to cover the first foundation layer and the convex portions of the substrate.

5. The nitride semiconductor light emitting element according to claim 1,
wherein the light emitting layer is formed with a multiple quantum well where a well layer and a barrier layer are alternatively deposited, and includes four or more undoped barrier layers or lightly doped barrier layers which are doped with an n-type dopant and in which a dopant concentration is 2×10$^{17}$ cm$^{-3}$ or less.

6. The nitride semiconductor light emitting element according to claim 5,
wherein the barrier layer has a thickness equal to or more than 3 nm but equal to or less than 7 nm.

7. The nitride semiconductor light emitting element according to claim 1,
wherein the n-type nitride semiconductor layer includes an intermediate layer below the light emitting layer and includes a multilayer structure member below the intermediate layer,
the intermediate layer is formed by depositing a plurality of nitride semiconductor layers and is formed by alternately depositing a nitride semiconductor layer whose band gap energy is relatively lower than a band gap energy of an adjacent nitride semiconductor layer and a nitride semiconductor layer having a relatively higher band gap energy and
the multilayer structure member is formed by depositing a plurality of nitride semiconductor layers, and is formed by alternately depositing a nitride semiconductor layer which has a thickness more than a thickness of each of the layers of the intermediate layer and whose band gap energy is relatively lower than a band gap energy of an adjacent nitride semiconductor layer and a nitride semiconductor layer which has a thickness more than the thickness of each of the layers of the intermediate layer and whose band gap energy is relatively higher than a band gap energy of an adjacent nitride semiconductor layer.

8. The nitride semiconductor light emitting element according to claim 1,
wherein the n-type nitride semiconductor layer includes a lower n-type nitride semiconductor layer and an n-type nitride semiconductor modulation doped layer formed on the lower n-type nitride semiconductor layer, and
the n-type nitride semiconductor modulation doped layer includes at least a nitride semiconductor layer whose n-type dopant concentration is lower than an n-type dopant concentration of the lower n-type nitride semiconductor layer.

9. The nitride semiconductor light emitting element according to claim 1,
wherein the n-type nitride semiconductor layer includes the lower n-type nitride semiconductor layer and a low-temperature n-type nitride semiconductor layer that is provided on the lower n-type nitride semiconductor layer and that is grown at a temperature which is 50° C. to 400° C. lower than the lower n-type nitride semiconductor layer, and
an n-type dopant concentration of the low-temperature n-type nitride semiconductor layer is 1.1 times as high as an n-type dopant concentration of the n-type nitride semiconductor layer.

10. The nitride semiconductor light emitting element according to claim 7,
wherein
the intermediate layer is a superlattice layer that is formed by depositing a plurality of nitride semiconductor layers and that is formed by alternately depositing a nitride semiconductor layer whose band gap energy is relatively lower than a band gap energy of an adjacent nitride semiconductor layer and a nitride semiconductor layer having a relatively higher band gap energy and
in the intermediate layer, at least two nitride semiconductor layers located on a side of the light emitting layer are formed with an n-type semiconductor layer, and an nitride semiconductor layer located on a side of the substrate as compared with the n-type semiconductor layer is formed with an undoped layer.

* * * * *